(12) United States Patent
Burberry et al.

(10) Patent No.: US 8,710,854 B2
(45) Date of Patent: Apr. 29, 2014

(54) MAKING TRANSPARENT CAPACITOR WITH MULTI-LAYER GRID

(75) Inventors: Mitchell Stewart Burberry, Webster, NY (US); Ronald Steven Cok, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 324 days.

(21) Appl. No.: 13/305,831

(22) Filed: Nov. 29, 2011

(65) Prior Publication Data

US 2013/0134996 A1    May 30, 2013

(51) Int. Cl.
    *G01R 27/26*     (2006.01)
    *G06F 3/041*     (2006.01)

(52) U.S. Cl.
    USPC ........................... 324/686; 324/679; 345/173

(58) Field of Classification Search
    USPC ......... 324/679, 658, 649, 600, 661, 686, 519, 324/750.17, 754.28; 345/173, 174, 175; 349/38, 39; 362/84, 235, 249.01, 362/249.02
    See application file for complete search history.

(56) References Cited

U.S. PATENT DOCUMENTS

| | | | |
|---|---|---|---|
| 4,394,661 A | 7/1983 | Peeters | |
| 4,499,178 A | 2/1985 | Wada et al. | |
| 4,650,742 A | 3/1987 | Goto et al. | |
| 6,243,127 B1 | 6/2001 | Burberry et al. | |
| 6,532,111 B2 | 3/2003 | Kurtz et al. | |
| 6,645,444 B2 | 11/2003 | Goldstein | |
| 6,812,637 B2 | 11/2004 | Cok et al. | |
| 7,832,886 B2* | 11/2010 | Lin | 362/84 |
| 2006/0003262 A1 | 1/2006 | Yang et al. | |
| 2006/0057502 A1 | 3/2006 | Okada et al. | |
| 2009/0115924 A1* | 5/2009 | Yang et al. | 349/39 |
| 2009/0243634 A1* | 10/2009 | Mattson et al. | 324/686 |
| 2011/0254808 A1* | 10/2011 | Lin et al. | 345/175 |
| 2012/0062250 A1* | 3/2012 | Kuo | 324/686 |
| 2013/0135548 A1* | 5/2013 | Burberry et al. | 349/38 |

* cited by examiner

*Primary Examiner* — Hoai-An D Nguyen
(74) *Attorney, Agent, or Firm* — Raymond L. Owens

(57) ABSTRACT

A method of making a transparent capacitor apparatus includes: providing a first transparent substrate including a first patterned conductive layer having a first pattern; providing a second transparent substrate including a second patterned conductive layer having a second pattern different from the first pattern; locating the first transparent substrate over the second transparent substrate so that the first patterned conductive layer is effectively parallel to the second patterned conductive layer. Overlapping portions of both the first conductive layer and the second conductive layer are patterned time into spatially matching conductive areas and non-conductive areas by locally applying heat to melt conductive materials in the non-conductive areas so that the surface tension of the conductive materials causes the conductive materials to coalesce into structures with a reduced conductive layer area.

21 Claims, 16 Drawing Sheets

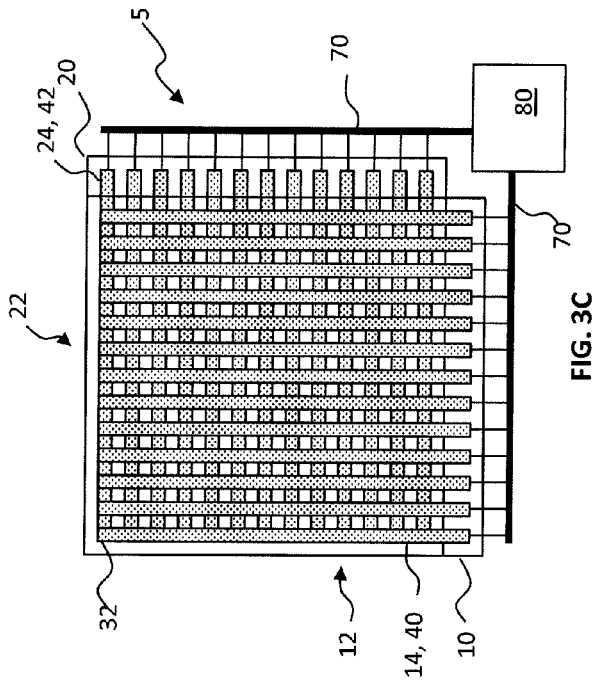
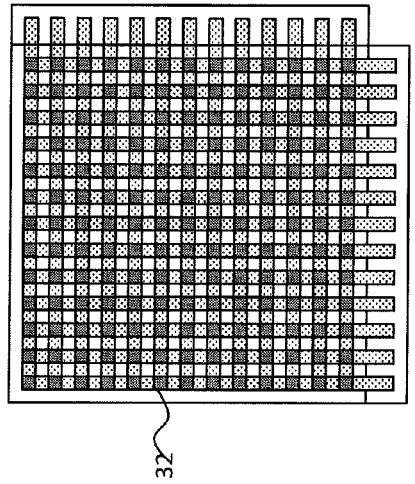
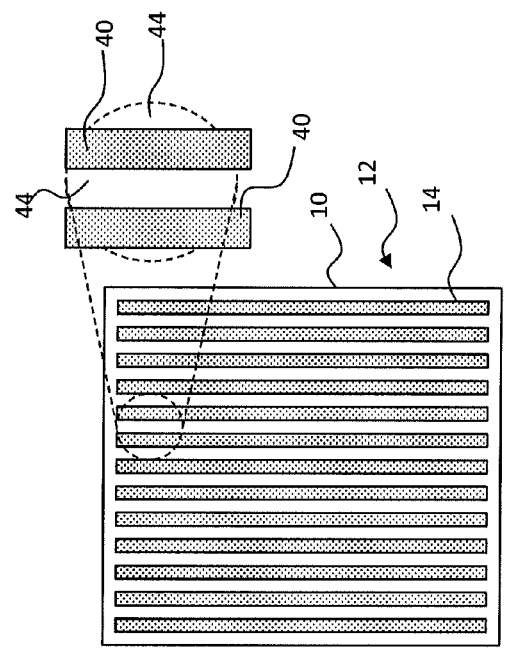
FIG. 3C
FIG. 3D
FIG. 3B
FIG. 3A

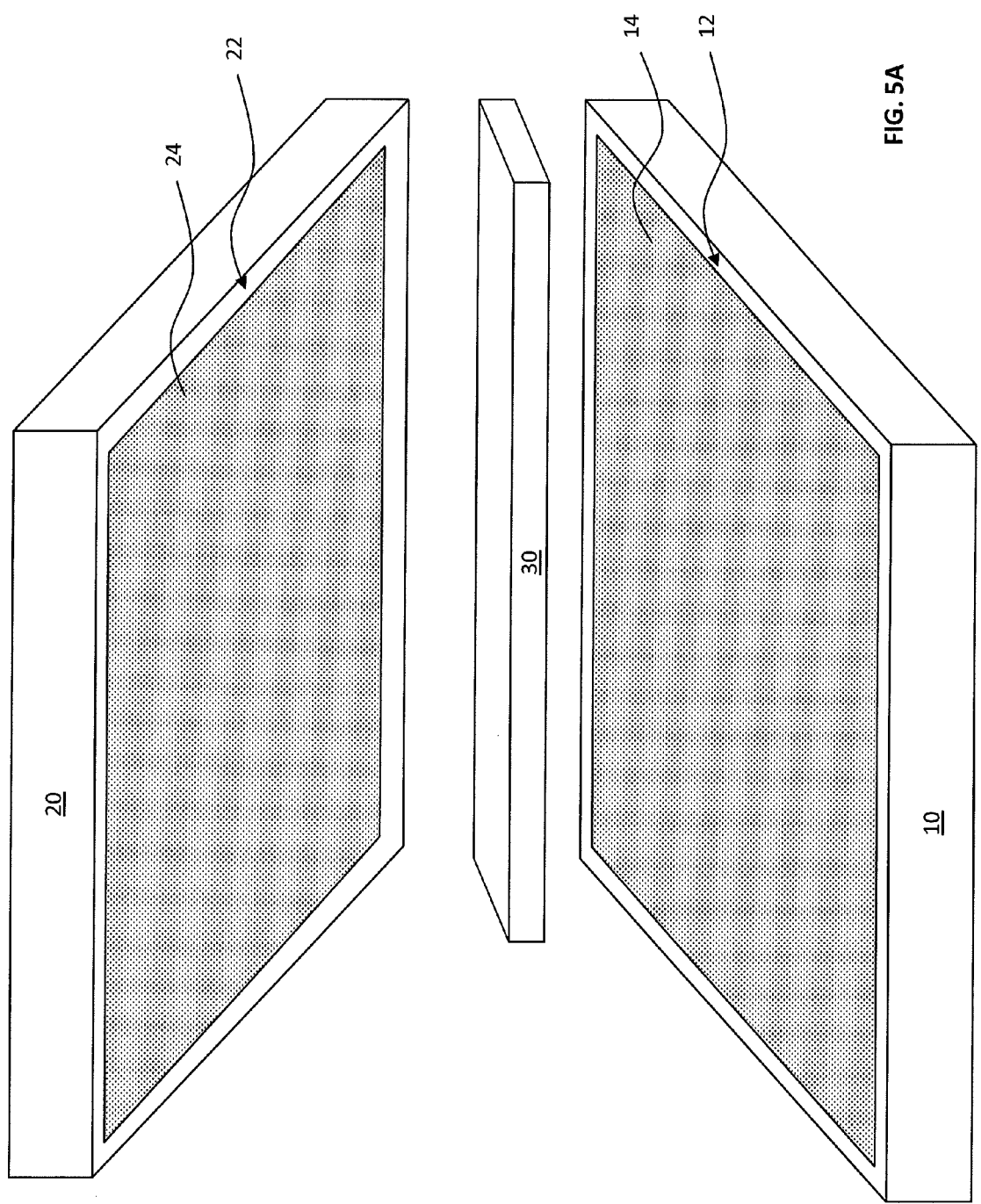

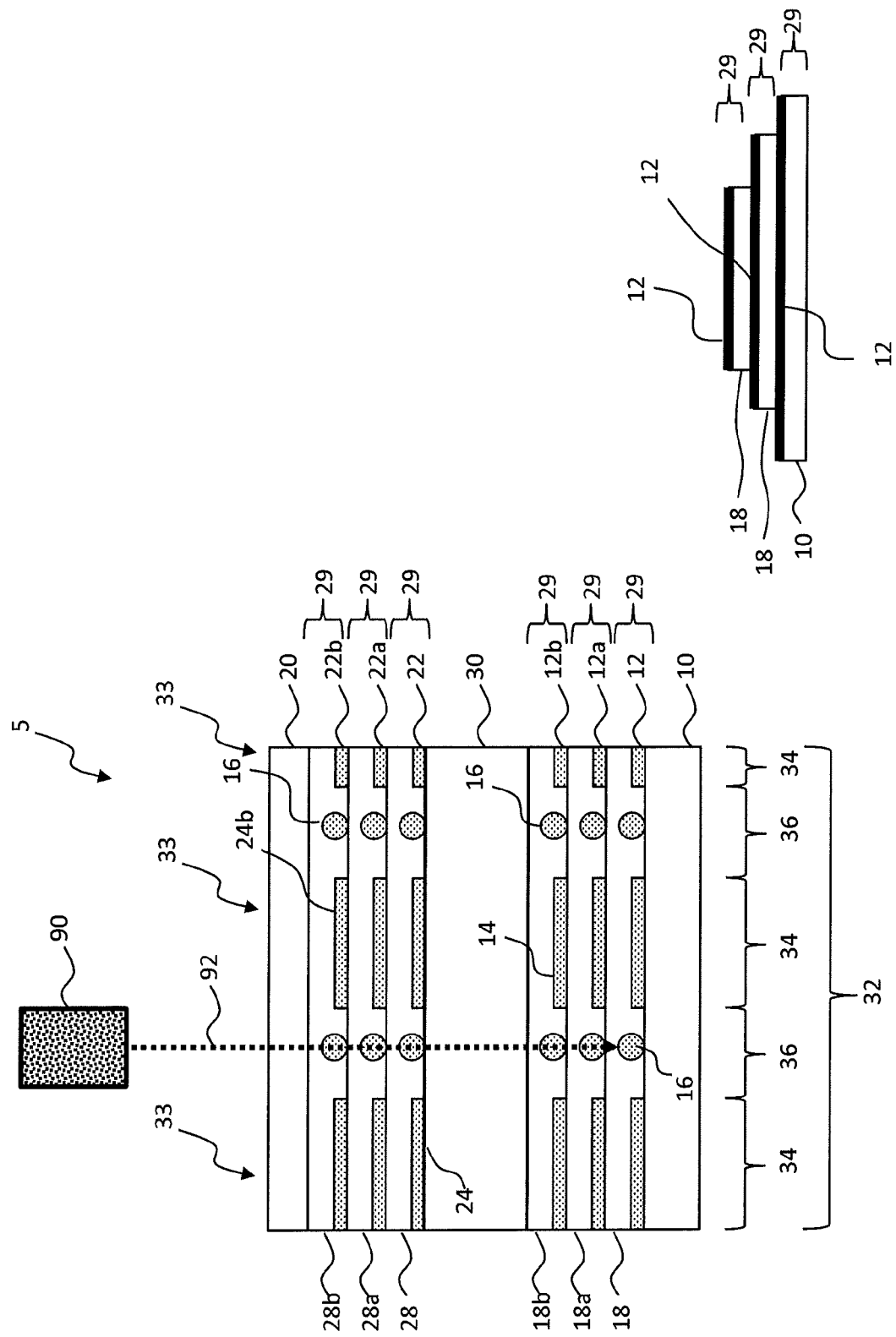

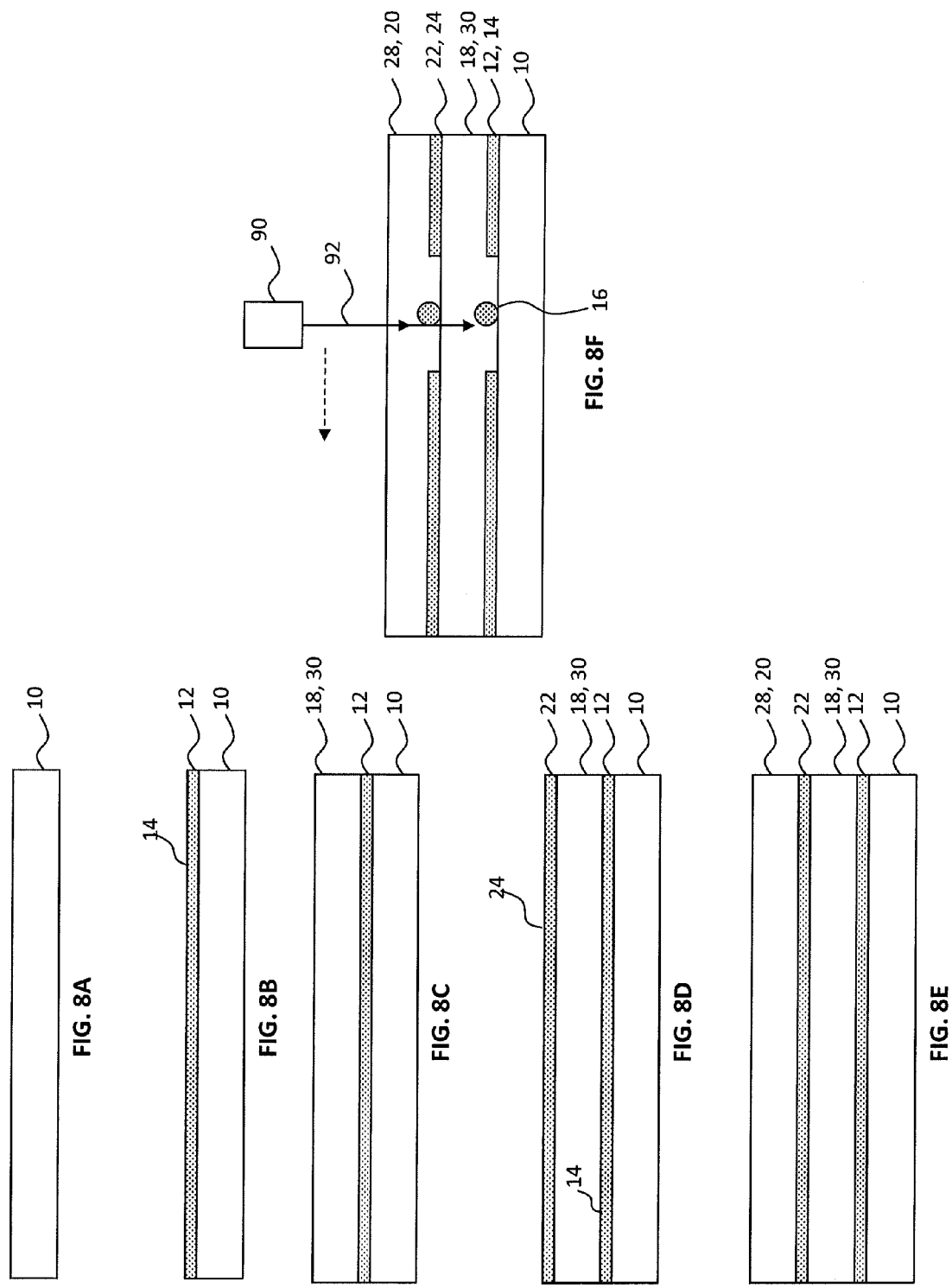

MAKING TRANSPARENT CAPACITOR WITH MULTI-LAYER GRID

CROSS-REFERENCE TO RELATED APPLICATIONS

Reference is made to commonly-assigned, co-pending U.S. patent application Ser. No.13/305,815 filed concurrently herewith, entitled "TRANSPARENT CAPACITOR WITH MULTI-LAYER GRID STRUCTURE" by MITCHELL BURBERRY, ET AL., the disclosure of which is incorporated herein.

FIELD OF THE INVENTION

The present invention relates to transparent capacitors.

BACKGROUND OF THE INVENTION

Transparent conductors are widely used in the flat-panel display industry to form electrodes that are used to electrically switch the light-emitting or light-transmitting properties of a display pixel, for example in liquid crystal or organic light-emitting diode displays. Transparent conductors are also used to create electrodes for transparent capacitors used in capacitive touch-screen in conjunction with displays. In such displays, the transparency and conductivity of the transparent electrodes are important attributes. In general, it is desired that transparent electrodes have a high transparency (for example, greater than 90% in the visible spectrum) and a high conductivity (for example, less than 10 ohms/square).

Typical prior-art materials for such electrodes include indium tin oxide (ITO) and very thin layers of metal, for example silver or aluminum or metal alloys including silver or aluminum. These materials are coated, for example by sputtering or vapor deposition, and patterned on display substrates, such as glass. However, the current-carrying capacity of such electrodes is limited, thereby limiting the amount of power that can be supplied to the pixel elements. Moreover, the substrate materials are limited by the deposition process (e.g. sputtering). Thicker layers of metal oxides or metals increase conductivity but reduce the transparency of the electrodes.

Various methods of improving the conductivity of transparent conductors are taught in the prior art. For example, issued U.S. Pat. No. 6,812,637 entitled "OLED Display with Auxiliary Electrode" by Cok, describes an auxiliary electrode to improve the conductivity of the transparent electrode and enhance the current distribution. It is also known to provide wire grids on transparent substrates to provide optical control of incident light. For example, U.S. Pat. No. 6,532,111 describes a wire-grid polarizer. However, the formation of such metal grids is problematic. Sputtering through a shadow mask is difficult for large substrates due to thermal expansion and alignment problems of the shadow mask. Likewise, evaporative deposition of conductive materials such as metals requires high temperatures and suffers from the same mask problems. High temperatures can also destroy any temperature-sensitive underlying layers or substrates. The use of photolithography to pattern metal layers, metal-oxide layers, or metal grids can compromise the integrity of underlying layers. Furthermore, a metal grid is not transparent and can cover only a relatively small proportion of the transparent conductor area, reducing the conductivity of the auxiliary electrode.

It is also known in the prior art to form conductive traces using nano-particles comprising, for example silver. The synthesis of such metallic nano-crystals is known. For example, U.S. Pat. No. 6,645,444 B2 entitled "Metal nano-crystals and synthesis thereof" describes a process for forming metal nano-crystals optionally doped or alloyed with other metals. US20060057502 A1 entitled "Method of forming a conductive wiring pattern by laser irradiation and a conductive wiring pattern" describes fine wirings made by a method having the steps of painting a board with a metal dispersion colloid, drying the metal dispersion colloid into a metal-suspension film, irradiating the metal-suspension film with a laser beam of 300 nm-550 nm wavelengths, depicting arbitrary patterns on the film with the laser beam, aggregating metal nano-particles into larger conductive grains, washing the laser-irradiated film, eliminating non-irradiated metal nano-particles, and forming metallic wiring patterns built by the conductive grains on the board thus enabling an inexpensive apparatus to form fine arbitrary wiring patterns on boards without expensive photo-masks, resists, exposure apparatus and etching apparatus. US20060003262 similarly discloses a method of forming a pattern of electrical conductors on a substrate, wherein metal nano-particles can be mixed with a light-absorbing dye, and the mixture is then coated on the substrate. However, the wirings made with such materials are not transparent, particularly in combination with desired conductivity.

U.S. Pat. No. 4,394,661 relates to a thin metal masking film that will coalesce or "ball up" when heated rapidly with a high-intensity laser beam. This reduces the coverage of the metal film over a substrate and increases optical transmission. However, there is a problem with using such an element in that the optical density is not sufficient for many applications. If a thick metal film is employed in order to increase optical density, then the efficiency for coalescence decreases and the size of the debris created upon heating increases. U.S. Pat. No. 4,650,742 relates to a method of using an optical recording medium having two metal layers sandwiching a sublimable organic layer. There is a problem with this method, however, in that removing the sublimable organic layer requires a material collection apparatus and can be environmentally detrimental. U.S. Pat. No. 4,499,178 relates to a method of using an optical recording material where a heat insulating layer is interposed between a metallic recording layer and a reflecting layer. There is a problem with using this method in that the reflecting layer does not coalesce and therefore does not add to the image contrast. U.S. Pat. No. 6,243,127 describes a process of forming an image using a multi-layer metal coalescence thermal recording element. However, these prior-art methods do not form conductive and transparent electrodes.

As is known and practiced in the prior art, multiple layers of transparent conductors patterned on one or more transparent substrates can form capacitive arrays used in touch screens. In these applications, it is important to align the multiple layers to improve the capacitance of the layers of transparent conductors and to provide coverage of capacitors over the transparent substrate. Such alignment and patterning of multiple layers of transparent conductors is typically done with high-resolution photolithography equipment. Such equipment can be very expensive and limit manufacturing throughput and the materials used have limited conductivity and transparency.

There is a need, therefore, for an improved method for providing increased conductivity and transparency to the electrodes of a capacitive device that is scalable to large sizes, avoids heating materials in sensitive locations, enables simple layer alignment, and avoids the use of chemical processes and photolithographic equipment.

SUMMARY OF THE INVENTION

In accordance with the present invention, a method of making a transparent capacitor apparatus comprises:

providing a first transparent substrate including a first patterned conductive layer having a first conductive material over the first transparent substrate in a first pattern;

providing a second transparent substrate including a second patterned conductive layer having a second conductive material over the second transparent substrate in a second pattern different from the first pattern;

locating the first transparent substrate over the second transparent substrate so that the first patterned conductive layer is effectively parallel to the second patterned conductive layer; and patterning overlapping portions of both the first conductive layer and the second conductive layer at the same time into spatially matching conductive areas and non-conductive areas by locally applying heat to melt the first and second conductive materials in the non-conductive areas of both the first conductive layer and the second conductive layer so that the surface tension of the first and second conductive materials causes the first and second conductive materials to coalesce into structures with a reduced conductive layer area.

The present invention provides an improved apparatus and method for providing increased conductivity and transparency to the electrodes of a capacitive device that is scalable to large sizes, avoids heating materials in sensitive locations, enables simple layer alignment, and avoids the use of chemical processes and photolithographic equipment. The present invention can also enable flexible substrates used in capacitive touch-screen device to create flexible displays with touch-screen interactivity.

These, and other, attributes of the present invention will be better appreciated and understood when considered in conjunction with the following description and the accompanying drawings. It should be understood, however, that the following description, although indicating embodiments of the present invention and numerous specific details thereof, is given by way of illustration and not of limitation. For example, the summary descriptions above are not meant to describe individual separate embodiments whose elements are not interchangeable. Many of the elements described as related to a particular embodiment can be used together with, and interchanged with, elements of other described embodiments. The figures below are not intended to be drawn to any precise scale with respect to relative size, angular relationship, or relative position or to any combinational relationship with respect to interchangeability, substitution, or representation of an actual implementation.

BRIEF DESCRIPTION OF THE DRAWINGS

The above and other features and advantages of the present invention will become more apparent when taken in conjunction with the following description and drawings wherein identical reference numerals have been used to designate identical features that are common to the figures, and wherein:

FIG. 3A is a plan view illustrating a patterned conductive layer useful in understanding the present invention;

FIG. 3B is a plan view illustrating a differently patterned conductive layer useful in understanding the present invention;

FIG. 3C is a plan view illustrating an overlay of the plan views of FIGS. 3A and 3B useful in understanding the present invention;

FIG. 3D is a plan view illustrating another overlay of the plan views of FIGS. 3A and 3B useful in understanding the present invention;

FIG. 5A is a perspective illustrating a step in a method of an embodiment of the present invention;

FIG. 6A is a cross section illustrating a method and structure according to embodiments of the present invention;

FIG. 6B is a cross section illustrating layer structures useful in understanding embodiments of the present invention;

FIGS. 8A-8F are successive cross sections illustrating a method of the present invention;

DETAILED DESCRIPTION OF THE INVENTION

Figure 1A:
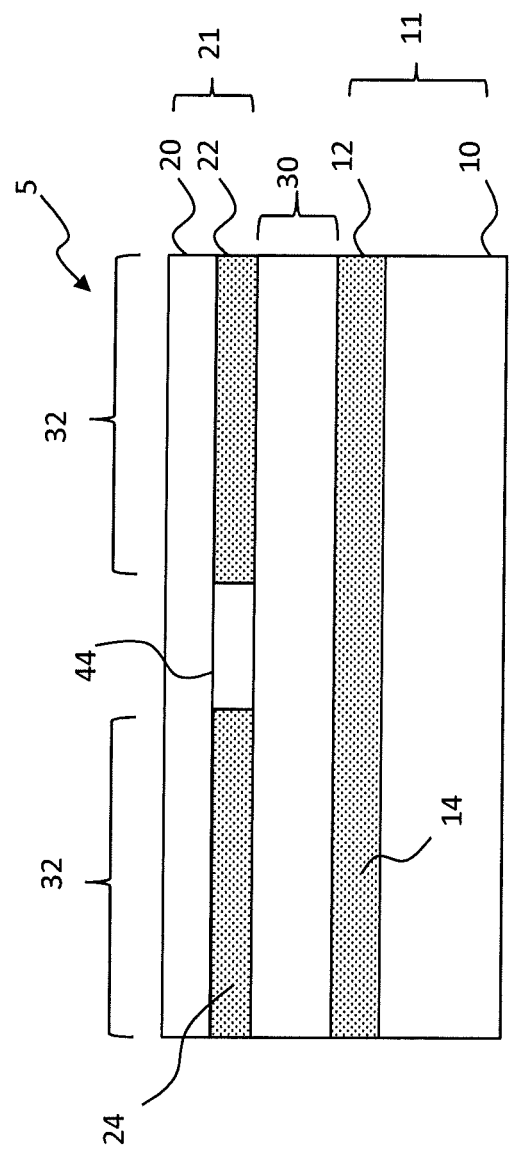
FIG. 1A is a cross section illustrating an apparatus according to an embodiment of the present invention.

Referring to FIG. 1A according to an embodiment of the present invention, a transparent capacitor apparatus 5 includes a first transparent substrate 10 including a first patterned conductive layer 12 having a first conductive material 14 located over the first transparent substrate 10 forming a first substrate structure 11. A dielectric layer 30 is located over the first patterned conductive layer 12. A second patterned conductive layer 22 including a second conductive material 24 is located over the dielectric layer 30. The pattern of the second patterned conductive layer 22 is different from the pattern of the first patterned conductive layer 12. The first and second patterned conductive layers 12, 14 include gaps 44 defining the patterns. A second transparent substrate 20 is located over the dielectric layer 30, for example over the second patterned conductive layer 22 forming a second substrate structure 21. Portions 32 of the first conductive material 14 of the first patterned conductive layer 12 overlap portions 32 of the second conductive material 24 of the second patterned conductive layer 22. The various layers indicated can be formed directly on each other as indicated in FIG. 1A or other intervening layers can be incorporated into the multi-layer stack and included in the first and second substrate structures 11, 21.

Figure 1B:
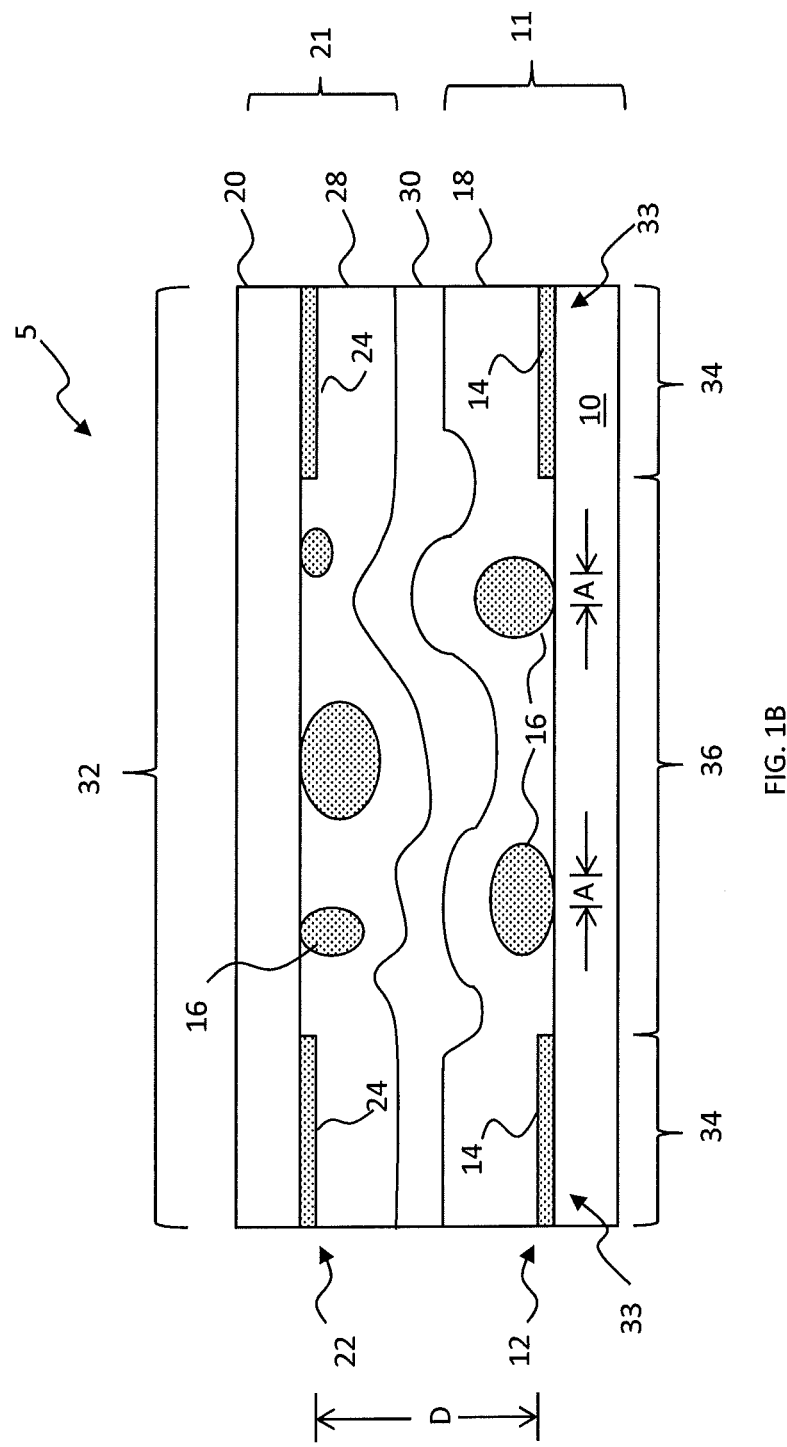
FIG. 1B is a cross section illustrating coalesced material useful in an embodiment of the present invention.

As shown in FIG. 1B, the overlapping portions 32 of the first and second conductive materials 14, 24 in the first and second patterned conductive layers 12, 22 form matching patterned electrical conductor(s) having spatially matching conductive areas 34 and non-conductive areas 36 separated by the dielectric layer 30. The non-conductive areas 36 of the first and second patterned conductive layers 12, 22 have encapsulated coalesced conductive material structures 16 that have a reduced coalesced material surface area A over the first or second transparent substrates 10 or 20 compared to the conductive material in the conductive areas 34.

The patterned electrical conductors in the overlapping portions 32 form capacitors 33 in the conductive areas 34. The non-conductive areas 36 do not conduct electricity from one side of the non-conductive area 36 to another side and are electrically isolated from the conductive areas 34. In an embodiment, the first and second transparent substrates 10, 20 or the first and second conductive materials 14, 24 in the conductive areas 34 are largely planar and parallel so that the distance D between them is relatively constant, for example varying by less than 10%, less than 1%, or less than 0.1%. The first and second conductive materials 14, 24 can be formed directly on the first and second transparent substrates 10, 20 and are largely planar in the conductive areas 34 but have a more three-dimensional structure in the non-conductive areas 36 where the first and second conductive materials 14, 24 can form spherical-like, cylindrical-like, or ellipsoidal-like structures having a smaller surface area than the more planar first and second conductive materials 14, 24 in the conductive areas 34.

FIG. 1B also illustrates a first encapsulating layer 18 formed over the first transparent substrate 10 and first patterned conductive layer 12 to form the first substrate structure 11. A second encapsulating layer 28 is located over the dielectric layer 30 that, together with the second transparent substrate 20 and second patterned conductive layer 22 form the second substrate structure 21. The first and second encapsulation layers 18, 28 protect the first and second conductive layers 12, 22 from environmental damage, such as moisture, chemical, and mechanical damage.

The encapsulated coalesced conductive material structures 16 are formed by locally applying heat, for example with a laser, to the first and second conductive layer materials 14, 24 in the non-conductive areas 36. Heat can be applied together to both the conductive layer materials 14, 24 in any non-conductive area 36 so that the first and second conductive materials 14, 24 in the exposed non-conductive areas 36 melt. Surface tension in the first and second conductive materials 14, 24 then causes the melted first and second conductive materials 14, 24 to coalesce and form conductive material structures 16 having a reduced surface area A and a more three-dimensional structure. The three-dimensional structure can, in turn cause the first and second encapsulating layers 18, 28, and the dielectric layer 30 to locally deform. If the first or second transparent substrate 10, 20 are flexible, they can also deform. The first and second encapsulating layers 18, 28, and the dielectric layer 30 can form a conformal layer over the coalesced conductive material structures 16. If, for example, the heating and deformation process is performed under a reduced pressure or in a vacuum, or if the first and second transparent substrates 10, 20 or first and second patterned conductive layers 12, 22 are impermeable to ambient gases, little or no gas will pass through them. While pockets of vacuum can form in the first and second patterned conductive layers 12, 22, first and second encapsulation layers 18, 28 or dielectric layer 30, if the materials of the first and second transparent substrates 10, 20, first and second patterned conductive layers 12, 22, first and second encapsulation layers 18, 28 or dielectric layer 30 are at least somewhat plastic, they can deform to form a conformal layer over or around the coalesced conductive material structures 16 in the non-conductive areas 36.

Figure 12:
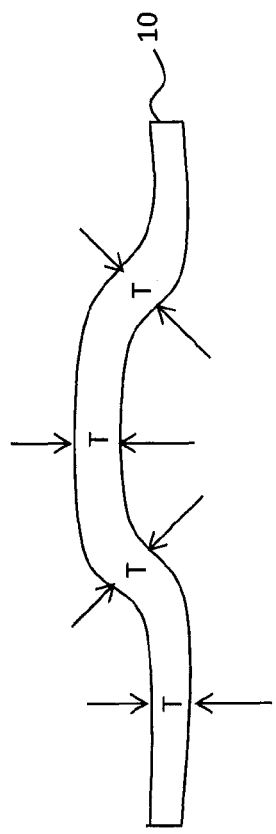
FIG. 12 is a cross section illustrating a curved, flexible substrate useful in an embodiment of the present invention.

Many polymer materials are plastic in nature; indeed, such polymers are often termed 'plastics', and can form such conformal coatings. Referring to the example of FIG. 1C, both the first transparent substrate 10 and the first encapsulating layer 18 are sufficiently plastic to deform when the coalesced conductive material structures 16 are formed from the first conductive material 14. A similar plasticity can be used in the second transparent substrate 20 (not shown). Such a flexibility and plasticity is useful if the transparent capacitor apparatus 5 is flexible and intended to be curved, either once or repeatedly, e.g. as illustrated in FIG. 12 where the first transparent substrate 10 is curved over its extent but maintains a relatively constant thickness T. Alternatively, one or the other, or both of the first and second transparent substrates 10, 20 can be rigid.

Figure 1C:
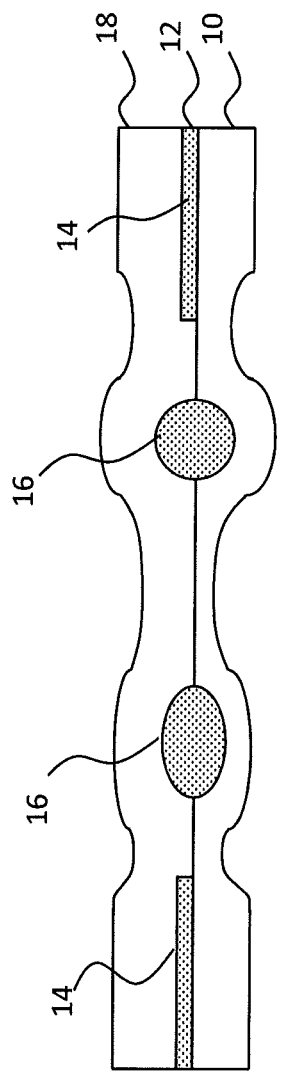
FIG. 1C is a cross section illustrating coalesced material in an alternative structure useful in understanding the present invention.

Referring to FIGS. 1B and 1C, because the volume of first and second conductive materials 14, 22 are small compared to the first and second transparent substrates 10, 20, the first and second patterned conductive layers 12, 22, the first and second encapsulation layers 18, 28, the first and second substrate 10, 20 and the first and second conductive materials 14, 24 in the conductive areas 34 can remain largely parallel, separated by a relatively constant distance D. The first and second conductive materials 14, 24 in the conductive areas 34 constitute capacitors 33 (FIG. 1B) that have relatively constant separation and electrical field strength in the conductive areas 34.

Either of the first and second transparent substrates 10, 20 can be glass, plastic, flexible glass, or any other transparent material that is readily formed into sheets having a surface suitable for the deposition of materials and other layers. The first and second conductive materials 14, 24 can be deposited directly on a surface of the first and second transparent substrates 10, 20, for example by vapor deposition, screen printing, inkjet deposition, or sputtering to form the first and second patterned conductive layers 12, 22. Suitable materials include conductive metals or metal alloys, for example silver, gold, aluminum, tin, titanium, tungsten, and nickel or alloys thereof. The first and second conductive materials 14, 24 can be the same materials. The first and second patterned conductive layers 12, 22 can be patterned by photolithographic processes such as etching, or pattern-wise deposited, for example through evaporation or sputtering through a mask, by printing through a patterned mask, or by a patterned transfer from another substrate. Such materials and deposition processes are known in the art.

First and second encapsulation layers 18, 28 can be flow-coated over the first and second patterned conductive layers 12, 22. The first and second encapsulation layers 18, 28 can be polymer or plastic, as can the dielectric layer 30. Methods of coating encapsulating materials, such as plastics, are well known in the art. Likewise, the dielectric layer 30 can be flow coated over the first encapsulation 18 or first patterned conductive layer 12.

In one embodiment of the present invention, the first and second transparent substrates 10, 20 with first and second patterned conductive layers 12, 22 are separately produced, located together in a stack, and then laminated, with a dielectric layer 30 located between the first and second patterned conductive layers 12, 22. Either subsequent to or before the lamination, the first and second conductive materials 14, 24, are heated at the same time to form the coalesced conductive material structures 16 in the non-conductive areas 36 of the first and second patterned conductive layer 12, 22. Lamination is useful to provide structural integrity and environmental robustness and to reduce optical reflections between layers. Likewise, to reduce reflections and refractions from the various layers, it is useful to employ common materials where possible. For example, the dielectric and encapsulating materials can be the same material or constitute a single layer.

Alternatively as shown in FIGS. 8A-8F, and 9A and described further below, in another embodiment of the present invention, the first transparent substrate 10 can be produced with a first patterned conductive layer 12 formed thereon, a dielectric layer 30 formed over the first patterned conductive layer 12, and a first encapsulating layer 28 or second transparent substrate layer 20 formed over the dielectric layer 30. A second patterned conductive layer 22 is then formed on the second encapsulating layer 28 or second transparent substrate 20 and another second encapsulating layer 28 or second transparent substrate 20 formed over the second patterned conductive layer 22. The first and second conductive materials 14, 24, are heated together to form the coalesced conductive material structures 16 in the non-conductive areas 36 of the first and second patterned conductive layer 12, 22.

In various embodiments, a variety of material and layer structures can be employed with the present invention. In particular, the dielectric layer 30 can be made of a substrate, e.g. first substrate 10 or second substrate 20 or both first transparent substrate 10 and second transparent substrate 20, or an encapsulation layer, if present, e.g. first encapsulation layer 18 or second encapsulation layer 28, or both first encapsulation layer 18 and second encapsulation layer 28.

Figure 2A:
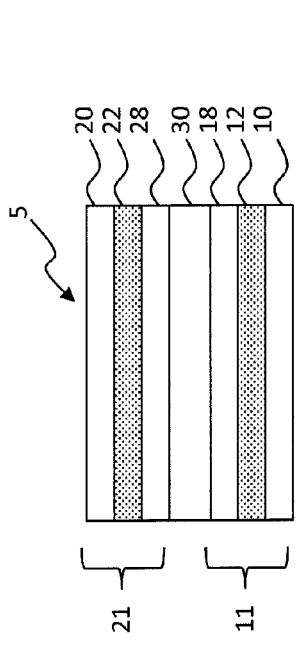
FIG. 2A is a cross section illustrating an apparatus according to an embodiment of the present invention.

Referring to FIG. 2A, the dielectric layer 30 is provided in addition to first and second encapsulation layers 18 and 28. The first and second transparent substrate 10, 20 are on the outsides of the transparent capacitor apparatus 5. In this embodiment, it can be convenient to form the first patterned conductive layer 12 on the first transparent substrate 10, and then coat the first patterned conductive layer 12 with the first encapsulation layer 18. Separately, the second patterned conductive layer 22 is formed on the second transparent substrate 20, and then the second patterned conductive layer 22 is coated with the second encapsulation layer 28. The dielectric layer 30 is either coated on either the first or second encapsulation layers 18, 28 and the first and second substrate structures 11, 21 (i.e. layers 10, 12, 18 and layers 20, 22, 28) are laminated together or the dielectric layer 30 is provided as a separate layer and laminated together with first and second substrate structures 11, 21.

Figure 2B:
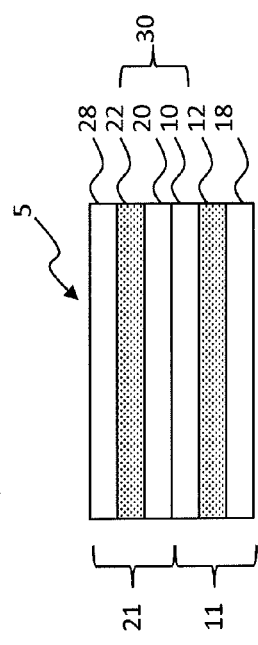
FIG. 2B is a cross section illustrating an alternative apparatus according to an embodiment of the present invention.

Referring to FIG. 2B, the dielectric layer 30 includes the first and second transparent substrates 10, 20. In this embodiment, the first and second substrate structures 11, 21 are each inverted so that the first and second encapsulation layers 18, 28 are on the outsides of the transparent capacitor apparatus 5. Alternatively, one of the first or second substrate structures 11, 21 can be inverted and the other is not inverted (not shown). This alternative arrangement would use a substrate structure (either 11 or 21) from FIG. 2A and a substrate structure (either 21 or 11) from FIG. 2B. This embodiment can be constructed as is the FIG. 2A transparent capacitor apparatus 5 with the modification that the first and second substrate structures 11 and 21 are inverted before the lamination step.

Figure 2C:
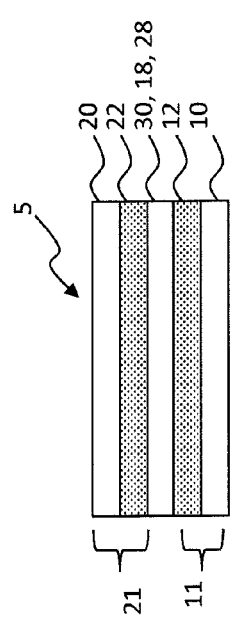
FIG. 2C is a cross section illustrating yet another apparatus according to an embodiment of the present invention.

Referring to FIG. 2C, the dielectric layer 30 includes or serves as the first and second encapsulation layers 18, 28. In this embodiment, the dielectric layer 30 is coated on either or both of the first or second patterned conductive layers 12, 22, or provided as a separate layer, and then laminated with the first and second substrate structures 11, 21 (that, in this example, do not include separate encapsulation layers).

Thus, in an embodiment, the dielectric layer 30 is separate from the first or second encapsulation layers 18, 28 and the first or second transparent substrates 10, 20. In another embodiment, the dielectric layer 30 serves as the first or second encapsulation layers 18, 28 or both the first and second encapsulation layers 18, 28. Alternatively, the first or second encapsulation layers 18, 28 or both the first and second encapsulation layers 18, 28 serve as a dielectric layer 30 or as the first or second transparent substrates 10, 20. In yet another alternative, the first or second transparent substrates 10, 20 serve as the dielectric layer 30.

In any, or all, of these embodiments, the conducting and non-conductive areas 34, 36 (FIG. 1B) can be formed after the first and second substrate layers 11, 21 are laminated with the dielectric layer 30 or coated. Alternatively, the conducting and non-conductive areas 34, 36 (FIG. 1B) can be formed before the first and second substrate layers 11, 21 are laminated with the dielectric layer 30. In this example, however, at least the first and second substrate structures 11, 21 should be located and secured together so that the non-conductive areas 36 can be formed together in both the first and second conductive layers 12, 22. In this embodiment, the dielectric layer 30 can be located between, and in contact with, the first and second substrate structures 11, 21 when the non-conductive areas 36 are formed. In other embodiments the first and second substrate structures 11, 21 are not laminated. In another embodiment, a lamination or annealing step is performed after the non-conductive areas 36 are formed.

Referring to FIGS. 3A, 3B, 3C, and 3D, the first and second patterned conductive layers 12, 22 are shown with plan views of the first and second transparent substrates 10, 20. Referring first to FIG. 3A, the first patterned conductive layer 12 has first conductive material 14 patterned into vertical first electrodes 40 formed on first transparent substrate 10. As shown in the detail portion of FIG. 3A, the vertical first electrodes 40 are separated by inter-electrode gaps 44. As shown in FIG. 3B, the second patterned conductive layer 22 has second conductive material 24 patterned into horizontal second electrodes 42 formed on second transparent substrate 20 that have a different pattern from the vertical first electrodes 40 (FIG. 3A). A variety of different patterns can be used in a corresponding variety of embodiments. A useful pattern uses vertical and horizontal electrodes 40, 42 that have the same pattern with different orientations, in the example of FIGS. 3A-3D each differing by a 90-degree rotation in the plane corresponding to either the first or second patterned conductive layer 12, 22, to form row 42 and column 40 electrodes. In other words, the first and second electrodes 40, 42 have orthogonal patterns that can be otherwise similar or identical. As shown in the detail portion of FIG. 3B, the horizontal second electrodes 42 are separated by inter-electrode gaps 44. The inter-electrode gaps 44 can be the same or different for the first and second patterned conductive layers 12, 22.

FIG. 3C is a plan view of FIG. 3A overlaid over FIG. 3B, for example as illustrated in the cross section of FIG. 1A, to form the transparent capacitor apparatus 5. As shown in FIG. 3C, the first transparent substrate 10 is located over the second transparent substrate 20 and the first patterned conductive layer 12 and first conductive materials 14 form vertical first column electrodes 40 located over and adjacent to the second patterned conductive layer 22 and first conductive materials 24 forming horizontal second row electrodes 42 separated by a dielectric layer (not shown). The column electrodes 40 and row electrodes 42 form orthogonal arrays of electrodes that can be matrix addressed as is commonly practiced in the display arts, for example with active-matrix flat-panel liquid crystal or organic light-emitting diode displays. Referring also to FIG. 3D and to FIG. 1A, the overlapping portions 32 of the row and column electrodes 42, 40 include conductive areas that constitute capacitors (not shown). As shown in FIG. 3C, electrical connections 70 are connected to the row and column electrodes 42, 40 and to a controller 80. The controller 80 includes circuits adapted to provide electrical power, charge, or electrical sensing to the row and column electrodes 42, 40 and thereby to the capacitors (not shown) for example by using matrix control to electrically activate one row electrode 42 or one column electrode 40 or to electrically activate all of the column electrodes 40 or row electrodes 42 while an orthogonal electrode is activated.

Figure 4A:
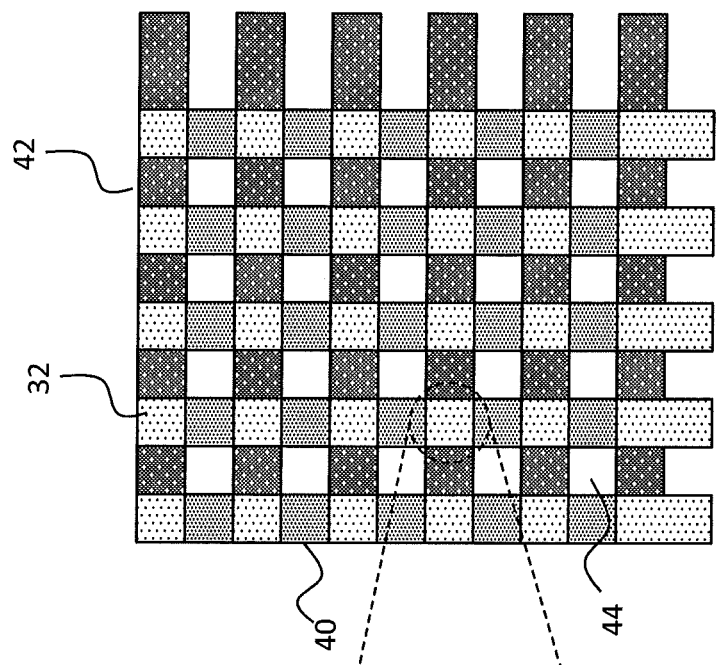
FIGS. 4A and 4B are more detailed plan views of a portion of FIG. 3D useful in understanding the present invention.
Figure 4B:
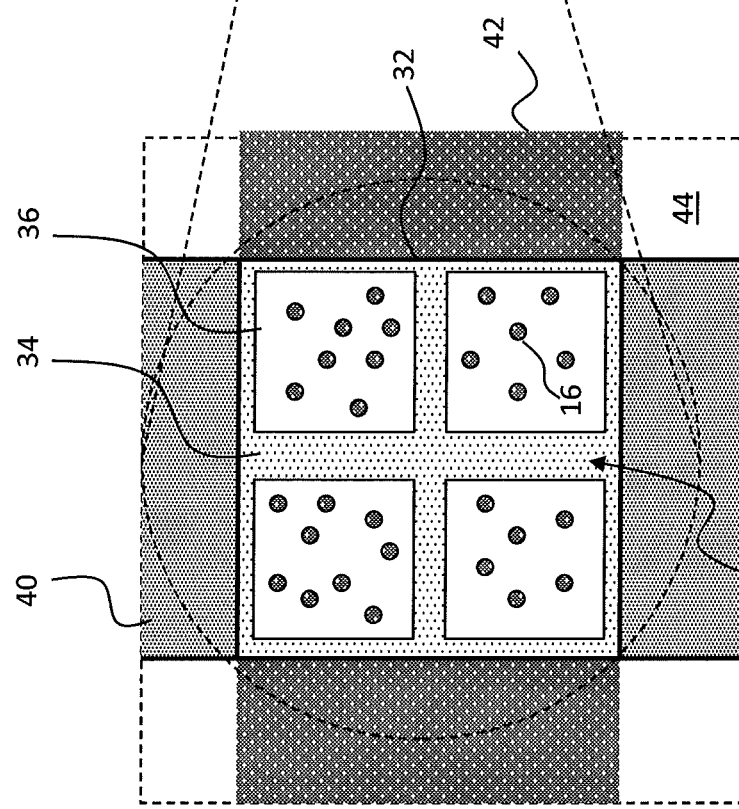

Referring to FIGS. 4A and 4B, an overlapping electrode portion 32 forming a capacitor 33 is illustrated in more detail. As noted above, the first and second patterned conductive layers 12, 22 (not shown) are patterned to form first and second electrodes 40, 42 having different patterns separated by inter-electrode gaps 44. Another, different patterned structure is formed within the overlapping electrode portions 32 in each of the first and second patterned conductive layers 12, 22. In this other patterned structure, both the first and second patterned conductive layers 12, 22 have the same pattern formed together by the local application of heat. The patterned, local application of heat melts the first and second conductive materials 14, 24 and causes coalesced conductive material structures 16 to form non-conductive areas 36 in the overlapping electrode portion 32 (FIG. 4B). Areas that are not heated remain conductive areas 34.

A variety of other patterned structures can be formed, for example a grid of orthogonal conductive areas 34 can be interspersed with rectangular non-conductive areas 36 (as shown in FIG. 4B). Alternatively, a hexagonal pattern of conductive areas 34 can be interspersed with hexagonal non-conductive areas 36 (not shown). The overlapping electrode portions 32 thus include non-conductive areas 36 and conductive areas 34 constituting capacitors 33. Since touch screens are operated by noting changes in capacitance rather than by storing a specific capacitive charge or having a specific capacitor structure, a capacitor 33 with a variable structure is effective in such applications.

It is important that the conductive areas 34 in the first patterned conductive layer 12 be aligned with the conductive areas 34 in the second patterned conductive layer 12 to effectively enable the capacitor 33 to store charge. It is a useful feature of the present invention that by forming the non-conductive areas 36 in both the first and second patterned conductive layers 12, 22 together, such alignment between the conductive areas 34 in the first and second patterned conductive layers 12, 22 is readily achieved without subsequent layer alignment or process step alignment as is found in conventional photolithographic processes.

The transparency of the overlapping portion 32 is determined by the relative area of the conductive areas 34 and the non-conductive areas 36. Assuming that the conductive areas 34 (coated with a conductive material such as metal) are opaque and that the non-conductive areas 36 are transparent, a simple geometric calculation can determine the transparency of the overlapping portion 32 by determining the ratio of the conductive area 34 to the non-conductive area 36. Similarly, the conductive area 34 determines the capacitance of the capacitor 33, together with the conductivity of the conductive materials (i.e. thickness and material composition) and spacing between the first and second patterned conductive layers 12, 22.

Figure 11:
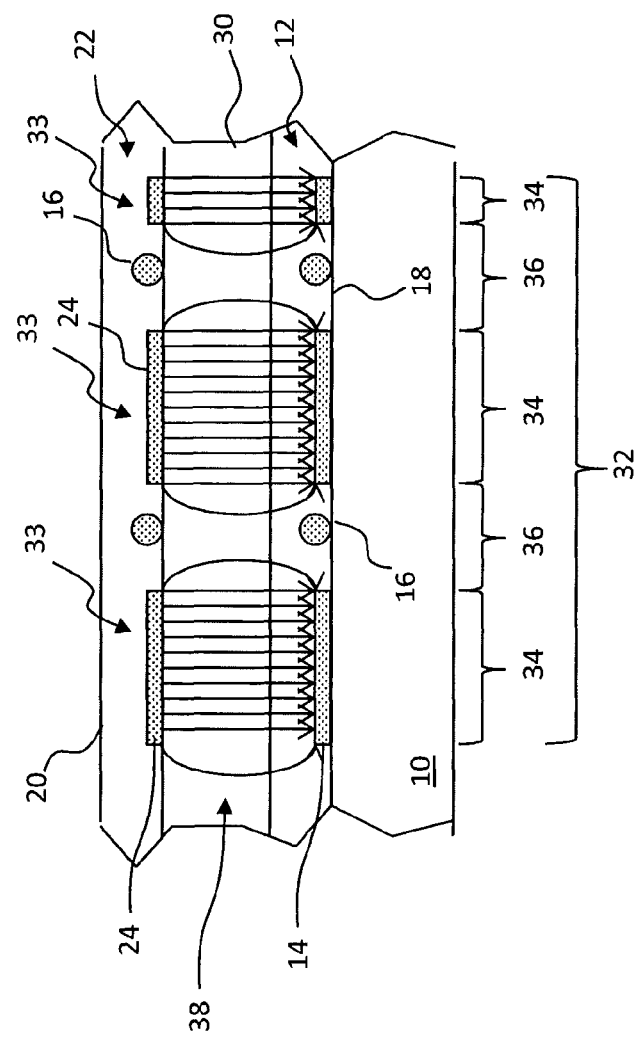
FIG. 11 is a cross section illustrating electromagnetic fields in an embodiment of the present invention.

Because the capacitor 33 stores charge in only the conductive areas 34, an electrical field 38 applied across the first and second patterned conductive layers 12, 22 will not be uniform, unlike conventional thin-film capacitors found in the prior art. Referring to FIG. 11, the electrical field 38 of a capacitor 33 formed from patterned first and second conductive materials 14, 24 in first and second patterned conductive layers 12, 22 on first and second transparent substrate 10, 20 is illustrated in cross section. Coalesced conductive material structures 16 are located in the non-conductive areas 36 within a first encapsulation layer 18 but, because coalesced conductive material structures 16 are electrically isolated from the conductive material in the electrodes, they do not carry an electrical field 38. Thus, the electrical field 38 of a capacitor 33 according to the present invention is present only in or near the conductive areas 34 and is variable across the extent of the overlapping portions 32.

The transparency and conductivity of the transparent capacitor apparatus 5 of the present invention depends on the percentage of the area covered by the first and second patterned conductive layers 12, 22. As noted above, within the overlapping portions 32 this is determined in part by the relative areas of the conductive and non-conductive areas 34, 36. However, the first and second electrodes 40, 42 in the non-overlapping portions 32 also affect the overall transparency of the transparent capacitor apparatus 5. To improve the transparency of the transparent capacitor apparatus 5, it can be helpful to make the non-conductive areas 36 as large as possible. The resolution of the transparent capacitor apparatus 5 is determined, in part, by the number of capacitors 33, and hence the number of first and second electrodes 40, 42. It is desirable, therefore, to increase the number and total area of the overlapping portions 32 and to reduce the non-capacitive area of the first and second electrodes 40, 42 to increase the transparency and resolution of the transparent capacitor apparatus 5. However, as will be appreciated by those skilled in the electrical arts, decreasing the conductive areas 34 to improve transparency will also decrease the capacitance of the capacitors 33.

The first and second electrodes 40, 42 can be made of the same conductive material as the first and second conductive materials 14, 24 in the conductive areas 34 of the overlapping portions 32. The first and second electrodes 40, 42 can be patterned in the non-capacitive areas using the same technique as for the capacitors 32. Because the patterns for the first and second electrodes 40, 42 are different, the first patterned conductive layer 12 and second patterned conductive layer 22 are patterned separately in at least some of the non-capacitive areas before the first and second transparent substrates 10, 20 are securely located together or laminated. Alternatively, the first and second electrodes 40, 42 can be made in other ways, for example through conventional deposition methods such as evaporative deposition and photolithography or deposition through a mask.

Because the first and second electrodes 40, 42 do not have to be carefully aligned (although they overlap to form capacitors 33), they can be made separately and with reduced precision and accuracy. In contrast, within the overlapping portions 32, alignment between the first and second patterned conductive layers 12, 22 is critical to create well-controlled capacitive structures. The first and second conductive material 14, 24 in the overlapping portions 32 should be precisely aligned in parallel layers. This is normally achieved in the prior art by using high-precision patterning and processing equipment (e.g. clean-room photolithography equipment). In contrast, according to embodiments of the present invention, by patterning both the first and second patterned conductive layers 12, 22 together in the overlapping portions 32 with locally applied heat, the present invention automatically aligns the first and second patterned conductive layers 12, 22 in the overlapping portions 32 and thereby reduces equipment alignment and processing requirements and provides a significant improvement over the prior art.

Referring to FIG. 6A, in a further embodiment of the present invention, one or more bi-layer structures 29 are formed to increase the conductivity of the first and second patterned conductive layer 12, 22 without reducing the transparency of the transparent capacitor apparatus 5. Each bi-layer 29 includes a first or second patterned conductive layer (e.g. 12a, 12b or 22a, 22b) and a corresponding first or second encapsulation layer (e.g. 18a, 18b or 28a 28b). The bi-layers 29 are formed between the first or second transparent substrates 10, 20, and the dielectric layer 30. The bi-layers 29 formed between the first transparent substrate 10 and the dielectric layer 30 have a first pattern matching the first patterned conductive layer 12. The bi-layers 29 formed between the second substrate 20 and the dielectric layer 30 have a second pattern matching the second patterned conductive layer 22. The first patterned conductive layer 12 and first encapsulating layer 18 illustrated in FIGS. 1B and 2A also form bi-layers as do the second patterned conductive layer 22 and second encapsulating layer 28. The bi-layers 29 on each side of the dielectric layer 30 are simply repeated patterned conductive layers with encapsulating layers having matching patterns.

As shown in FIG. 6A, the application of locally applied heat, for example with a laser, causes the first and second conductive material 14, 24 in each of the first and second patterned conductive layers 12, 12a, 12b and 22, 22a, 22b of the bi-layers 29 to melt and coalesce into separate coalesced conductive material structures 16, thereby rendering the local area a non-conductive area 36 while the remaining conductive areas 34 continue to conduct electricity and form additional layers of a non-interdigitated multi-layer capacitor 33. The various first patterned conductive layers 12, 12a, 12b of the bi-layers 29 are electrically connected as are the various second patterned conductive layers 22, 22a, 22b of the bi-layers 29, for example as shown in FIG. 6B by extending an edge of each of the bi-layers 29 slightly beyond those bi-layers 29 above it to provide space for an electrical connection to the first patterned conductive layers 12, 12a, 12b (or second patterned conductive layers 22, 22a, 22b, not shown) on the first encapsulating layer 18 or first transparent substrate 10 below.

According to a further embodiment of the present invention, at least one of the bi-layers is different from another bi-layer. The thicknesses of the first and second encapsulation layer (e.g. 18, 18a, 18b, 28, 28a, 28b) can be different as can the thicknesses of the first and second conductive layers 12, 12a, 12b, 22, 22a, 22b). Alternatively, the conductive layer in one bi-layer can be a different material from the conductive layer in another bi-layer. This can be useful, for example, in controlling reflection from the conductive layers. When used with a display device, it is useful to absorb ambient light while emitting light from the display. In this example, assuming that the second transparent substrate 20 is exposed to the ambient atmosphere while the first transparent substrate 10 is adjacent to a display device, it is helpful if the second patterned conductive layer 22b absorbs light while the remaining first and second patterned conductive layers 12, 12a, 12b, 22, 22a reflect light. Hence, second conductive layer material 24b can be darker (e.g. made of nickel) while the other first and second conductive layer materials 14, 24 are lighter (e.g. made of silver). Alternatively, a patterned light-absorbing layer can be formed over the second conductive layer material 24b, for example by evaporating or otherwise coating light-absorbing material over the second conductive layer material 24b and using the same heating process used to pattern the second conductive layer material 24b.

Just as was illustrated and discussed with respect to FIGS. 2A-2C, the encapsulating, substrate, and dielectric layers can serve various functions depending on their position in the layer stack. For example, first and second encapsulation layers 18, 28 or first and second transparent substrate 10, 20 can also serve as a dielectric layer if located between the first and second patterned conductive layers 12, 22. First and second encapsulation layers 18, 28 can also serve as a first and second transparent substrates 10, 20, or vice versa, depending on the positions of the layers in the layer stack.

In one embodiment of the structure illustrated in FIG. 6A, one or more of the encapsulation layers 18, 28 or the transparent substrates 10, 20 is a dielectric and the capacitor 33 is a multi-plate capacitor in which the plates are not inter-digitated. In another embodiment, one or more of the first and second encapsulation layers 18, 28 or the first and second transparent substrates 10, 20 are electrically conductive and increase the conductivity of the first and second patterned conductive layers 12, 22. Both dielectric and electrically conductive encapsulation materials, for example polymers are known in the art.

The first and second patterned conductive layers 12, 22, particularly but not exclusively in the conductive areas 34, can form an optical interference filter. If the separation between the various patterned conductive layers 12, 22 (e.g. the encapsulation layers 18, 28 thickness and dielectric layer 30) is carefully chosen, as are the thicknesses of the first and second conductive materials 14, 24, desirable optical effects, such as filtering or absorbing particular frequencies can be achieved. The thicknesses of the first and second conductive materials 14, 24 can be different for the different bi-layers 29 as can the thicknesses of the encapsulation layers 18, 28. One useful filtering effect can increase the absorption of a laser whose frequency is chosen to heat the conductive materials 14, 24 so as to melt the conductive materials 14, 24 and form the non-conductive areas 36. Other filtering effects can be chosen to absorb or transmit ambient light or light emitted from a display device associated with the transparent capacitor apparatus 5. Multi-layer optical interference filters are well known in the art.

Figure 7:
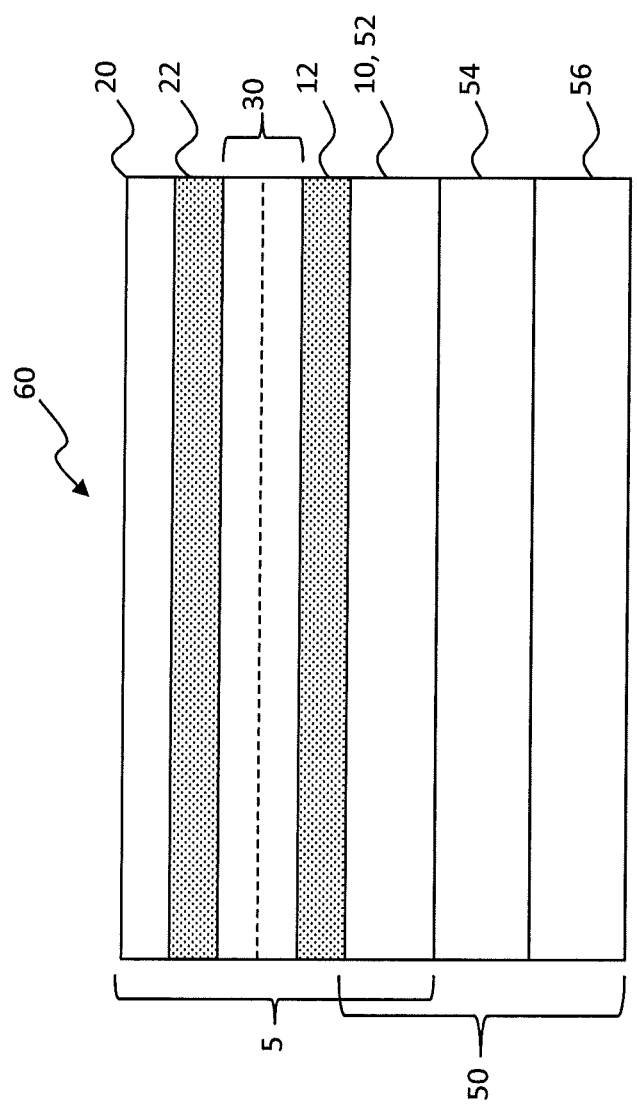
FIG. 7 is a cross section illustrating an embodiment of the present invention.

In a further embodiment of the present invention, the first transparent substrate 10 or the second transparent substrate 20 is a display device cover or substrate or is affixed to a display device cover or substrate. Referring to FIG. 7, a display device 50 includes a substrate 56, light-control layers 54 (e.g. a liquid crystal device or organic light-emitting diode device), and a display device cover 52. The display device cover 52 is also the substrate 10 of the transparent capacitor apparatus 5 that includes the first and second patterned conductive layers 12, 22, dielectric layer 30 and second transparent substrate 20. In such an arrangement with a combined display 50 and transparent capacitive apparatus 5, as is also illustrated in FIG. 3C, a useful embodiment of the present invention includes the first patterned conductive layer 12 orthogonal to the second patterned conductive layer 22 so that overlapping portions 32 of the first and second patterned conductive layers 12, 22 form an addressable array of capacitors 33 (not shown) having row and column electrodes 40, 42. In this embodiment, non-conductive encapsulation layers 18, 28 are useful. The capacitors 33 (not shown) can be addressed as an x, y array of capacitive elements using matrix addressing schemes and electrical connectors connecting the row and column electrodes 42, 40 to a controller 80 that provides electrical power or electrical sensing circuits for controlling the capacitor array and detecting and locating localized changes in the capacitance of any one or more of the capacitors 33 (not shown) in the array. In other embodiments of the present invention, the transparent capacitor apparatus 5 forms a capacitive touch screen.

According to an embodiment of the present invention, a method of making a transparent capacitor apparatus 5 includes providing a first transparent substrate 10 including a first patterned conductive layer 12 having a first conductive material 14 over the first transparent substrate 10 in a first pattern; providing a second transparent substrate 20 including a second patterned conductive layer 22 having a second conductive material 24 over the second transparent substrate 22 in a second pattern different from the first pattern; locating the first transparent substrate 10 over the second transparent substrate 20 so that the first patterned conductive layer 12 is effectively parallel to the second patterned conductive layer 22; and patterning overlapping portions 32 of both the first patterned conductive layer 12 and the second patterned conductive layer 22 at the same time into spatially matching conductive areas 34 forming capacitors 33 and non-conductive areas 36 by locally applying heat to melt the first and second conductive materials 14, 24 in the non-conductive areas 36 of both the first conductive layer 14 and the second conductive layer 24 so that the surface tension of the first and second conductive materials 14, 24 causes the first and second conductive materials 14, 24 to coalesce into structures 16 with a reduced conductive layer area.

Figure 5B:
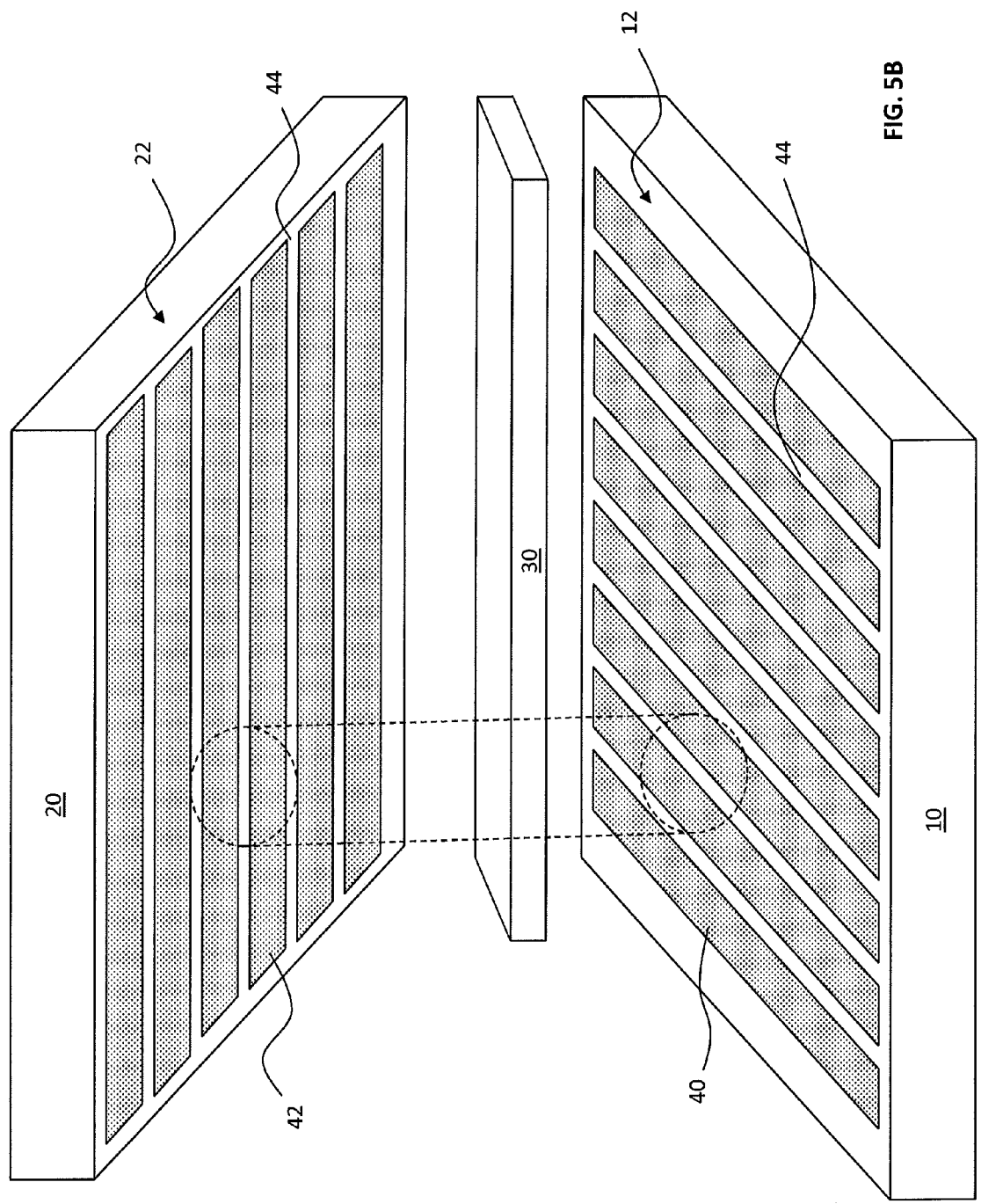
FIG. 5B is a perspective illustrating another step in a method of an embodiment of the present invention.
Figure 5C:
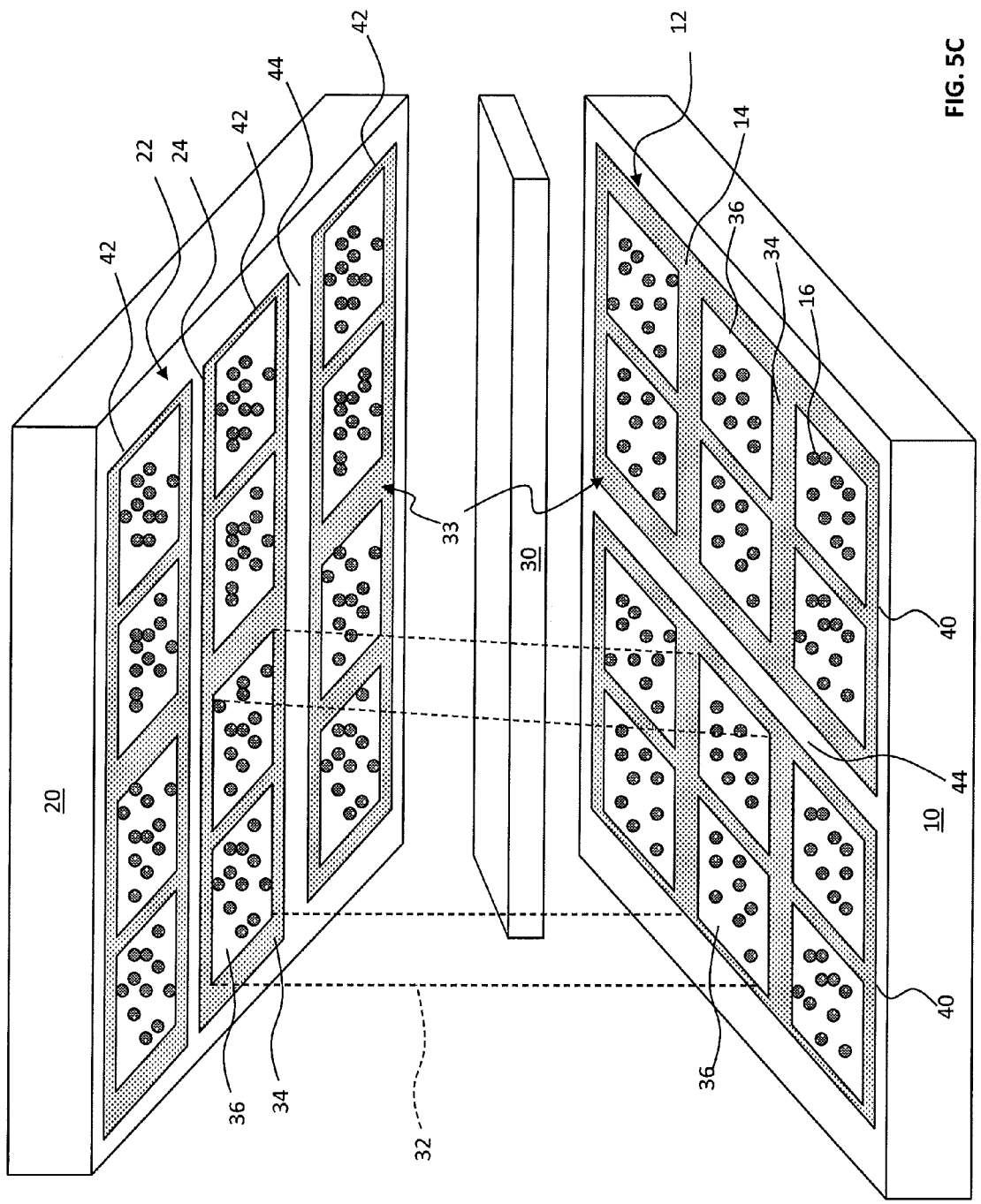
FIG. 5C is a perspective illustrating a structure in an embodiment of the present invention.
Figure 9A:
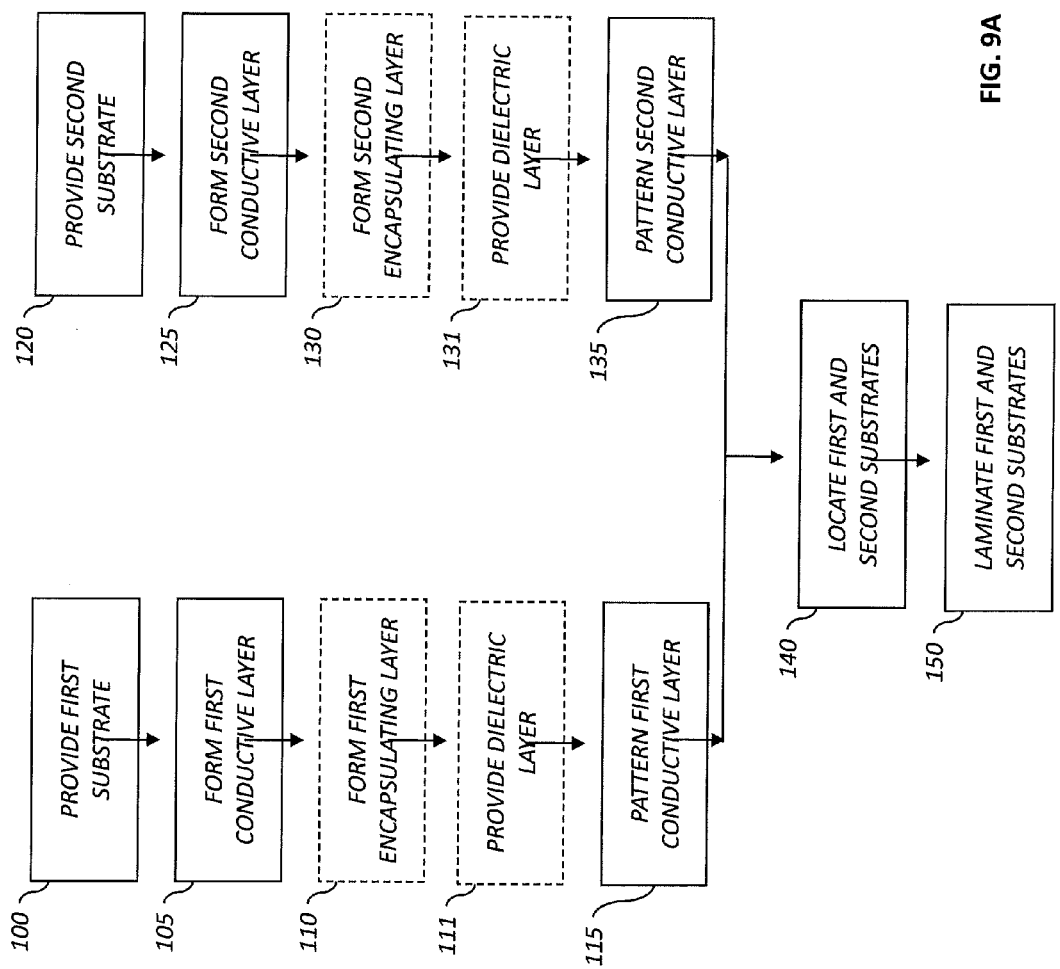
FIGS. 9A and 9B are flow diagrams illustrating a method according to an embodiment of the present invention.
Figure 9B:
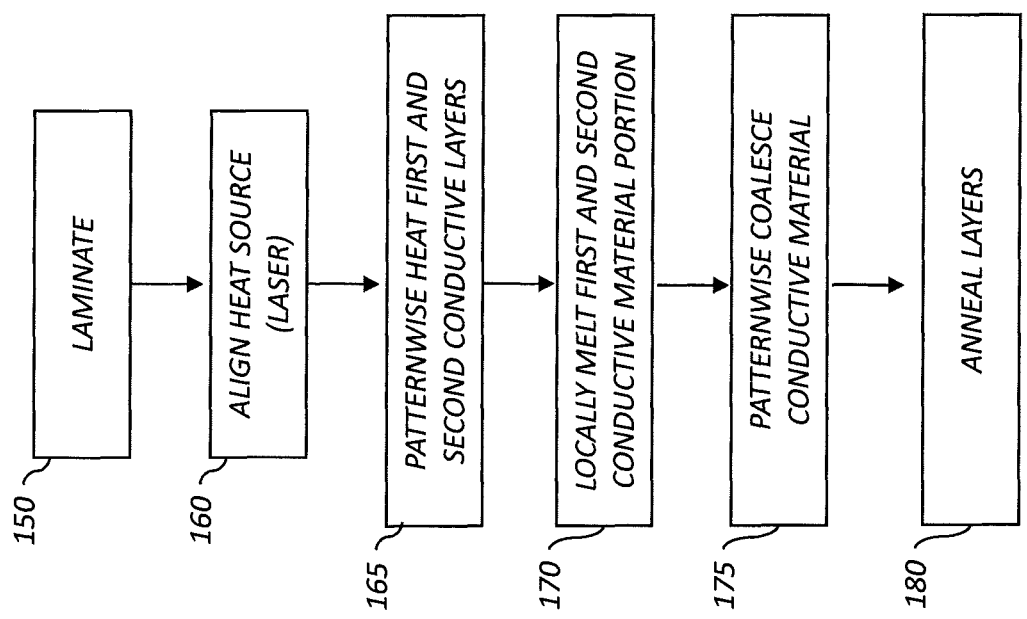
Figure 10:
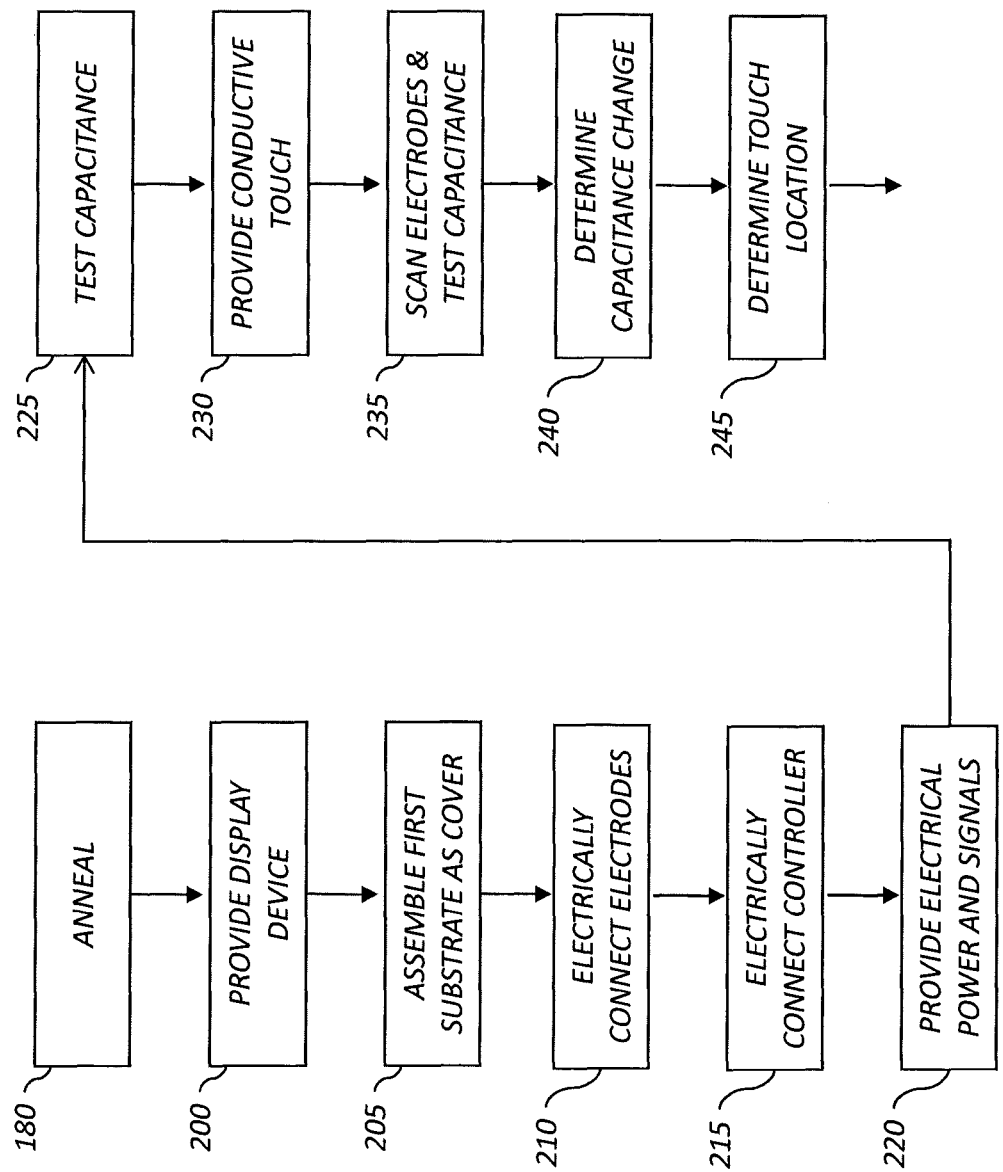
FIG. 10 is a flow diagram illustrating another method according to an embodiment of the present invention.

Various methods of the present invention are illustrated in the perspectives of FIGS. 5A-5C, the cross sections of FIGS. 8A-8F and the flow diagrams of FIGS. 9A-9B and FIG. 10. Referring first to FIGS. 5A, 8A, and 9A, a first transparent substrate 10 is provided in step 100. Likewise, a second transparent substrate 20 is provided in step 120. The first and second transparent substrates 10, 20 can be any useful transparent material having a surface suitable for forming the various layers of the present invention, for example glass or plastic. The first and second transparent substrates 10, 20 can be flexible or rigid. Such substrates are commercially available.

The first transparent substrate 10 is coated with a first conductive material 14 (FIGS. 5A, 8B) in step 105 and the second transparent substrate 20 is coated with a second conductive material 24 (FIG. 5A, 8D) in step 125. The first and second conductive materials 14, 24 can be the same materials, for example a metal or metal alloy and can be deposited, for example, by evaporation, inkjet deposition, coating dispersions of conductive materials and drying them, or by screen printing. In various embodiments of the present invention, the deposited first and second conductive materials 14, 24 are deposited in first and second conductive patterns or are patterned after deposition (e.g. as first and second orthogonal electrodes on the first and second substrates 10, 20) in steps 115 and 135 to form first and second patterned conductive layers 12, 22 (FIG. 5B, 8D). Photolithographic methods are known to accomplish patterning such layers, for example thin-film layers.

The pattern of the first conductive layer 12 is different from the pattern of the second conductive layer 22. The difference can be an orientation and the first and second conductive layers 12, 22 can form orthogonal arrays of electrodes 40, 42 separated by inter-electrode gaps 44 (FIG. 5B). The deposited conductive materials 14, 24 on first and second transparent substrates 10, 20 can be made or patterned independently, together, sequentially, at the same time, or supplied by a third party, with or without encapsulating or dielectric layers.

First and second encapsulating layers 18, 28 can be provided or coated over the first and second patterned conductive layers 12, 22 in steps 110 and 130 (FIG. 8C), as can a dielectric layer 30 (FIG. 5A, 5B, 8D) in steps 111 and 131. The dielectric layer 30 can be a first or second encapsulation layer 18 or 28 so that, in an embodiment, a separate step 111 or step 131 is optional. The layers can be provided separately and then laminated together or can be sequentially coated (e.g. as illustrated in the sequence of FIGS. 8A-8F). If the layers are sequentially coated as shown in FIG. 8D, conductive materials are deposited on the dielectric layer 30 and patterned (or deposited in a pattern) to form the second patterned conductive layer 22. A second encapsulating layer 28 or second transparent substrate 20 is formed over the second patterned conductive layer 22 (FIG. 8E).

If the first and second substrates 10, 20 or dielectric layer 30 are separately provided, they are located over each other with the dielectric layer 30 between the first and second patterned conductive layers 12, 22 (e.g. as illustrated in FIG. 5B) in step 140 and laminated in step 150. Alternatively, the first and second transparent substrates 10, 20 or dielectric layer 30 are secured together and then laminated after the non-conductive areas are formed. By laminating is meant that the various layers are permanently secured together, for example by heating and pressing the layers together, with or without additional adhesives. The various materials of the layers when formed or deposited can have adhesive properties, for example plastics can melt slightly and adhere to each other or other materials when exposed to heat or pressure.

Referring to the flow diagram of FIG. 9B, the detail perspective of FIG. 5C representing the circled portions of FIG. 5B, and FIG. 8F, the first and second transparent substrates 10, 20 and the dielectric layer 30 are located over each other as noted above together with a heat source in step 160 and then locally exposed in step 165 to a patterned heat source, for example by a laser 90 emitting a laser beam 92 to pattern-wise heat the first and second patterned conductive layers 12, 22 together. If multiple bi-layers are present (FIG. 6A) all of the first and second patterned conductive layers 12, 12a, 12b, 22, 22a, 22b are pattern-wise heated at the same time. The first and second materials 14, 24 of the first and second patterned conductive layers 12, 12a, 12b, 22, 22a, 22b in the non-conductive areas 36 melt in step 170 and, under the force of surface tension, coalesce into three-dimensional structures in step 175 to form coalesced conductive material structures 16 that no longer conduct electricity across the extent of the non-conductive areas 36. The patterned heat source 90 (e.g. the laser) can scan across the extent of the non-conductive areas 36 (e.g. by moving the laser beam 92 as indicated with the dashed arrow in FIG. 8F) one or more times in one or more directions to ensure that the conductive materials in the area are completely coalesced. Such scanning techniques are known in the art.

Referring in more detail to the example illustrated in the perspective of FIG. 5C, the first transparent substrate 10 has conductive materials 14 patterned to form a first conductive layer 12 thereon. The first patterned conductive layer 12 in this example forms two vertical (column) electrodes 40 and the second patterned conductive layer 22 in this example forms three horizontal (row) electrodes 42 separated by an inter-electrode gap 44. The first column and second row electrodes 40, 42 do not have to be aligned, but they do have to overlap to form overlapping portions 32 in which aligned capacitors 33 are formed. In this example, six capacitors 33 are formed that have conductive areas 34 separated by non-conductive areas 36. The non-conductive areas 36 are aligned and formed together by the local application of heat, for example from a laser beam, and include coalesced conductive material structures 16. Because the non-conductive areas 36 are formed after the first and second transparent substrates 10, 20 are laminated together (or at least secured together so that the first and second transparent substrates 10, 20 do not move relative to each other), the first and second transparent substrates 10, 20 do not themselves have to be carefully aligned, nor do the first and second electrodes 40, 42 have to be carefully aligned (so long as they overlap to form overlapping portions 32).

In a further method of the present invention, the first patterned conductive layer 12 is laminated to the second patterned conductive layer 22 with a dielectric layer 30 located between the first patterned conductive layer 12 and the second patterned conductive layer 22. The laminating can be done before or after the heat is locally applied to form the non-conductive areas 36, so long as the various layers are securely located together.

After the non-conductive areas 36 are formed, the first transparent substrate 10, second transparent substrate 20, and dielectric layer 30 and other layers can be annealed or further processed as a group to further improve their environmental robustness or resistance to de-lamination. Other layers can also be added, for example further encapsulation layers or optical treatments such as anti-reflective layers as are known in the art.

In a further embodiment of the present invention and as illustrated in FIG. 6A, a third transparent substrate (e.g. a first encapsulation layer 18a) including a third conductive layer (e.g. first patterned conductive layer 12a) having a third conductive material (e.g. first conductive material 14) over the third transparent substrate in the first pattern is provided. The third transparent substrate (first encapsulation layer 18a) is located with the first transparent substrate 10 so that the third patterned conductive layer (12a) is over or under the first patterned conductive layer 12, (formed on the first transparent substrate 10) in effectively parallel planes. Overlapping portions 32 of both the first patterned conductive layer 12 and the third patterned conductive layer 12a are patterned at the same time into spatially matching conductive areas 34 and non-conductive areas 36 by locally applying heat to melt the first and third conductive materials in the non-conductive areas 36 of both the first patterned conductive layer 12 and the third patterned conductive layer 12a so that surface tension of the first and third conductive materials causes the first and third conductive materials to coalesce into coalesced conductive material structures 16 with a reduced conductive layer area. This process of providing a patterning bi-layer 29, for example as illustrated in FIG. 6A can be repeated on either side of the dielectric layer 30. The bi-layers 29 can be provided separately and combined with the other layers of the present invention or can be formed as part of repeated coating steps to sequentially build the structures disclosed herein. Likewise, the bi-layers 29 can be laminated separately and then combined with the other layers of the present invention or can be laminated together with the other layers of the present invention.

A method of the present invention further includes coating the first conductive materials 14 on the first transparent substrate 10, patterning the first conductive layer 12, coating the second transparent substrate 20 over the first patterned conductive layer 12, patterning the second conductive layer 24, and patterning the first conductive layer 12 and the second conductive layer 22 together into matching conductive areas 34 and non-conductive areas 36.

As shown in FIG. 3C, in another embodiment of the present invention, a first electrical connection to the first patterned conductive layer 12 is formed. Likewise, a second electrical connection to the second patterned conductive layer 22 is formed. The first and second electrical connections are electrically connected to an electrical power source or electrical sensing device.

In further embodiments of the present invention and as illustrated in the flow diagram of FIG. 10 and the cross section of FIG. 7, after the transparent capacitive apparatus 5 is annealed (step 180) or otherwise completed, it can be provided as part of a display system 60 having a display including a display substrate 56, a light-control layers 54, and a display cover 52. Alternatively, the transparent capacitive device 5 can be made as part of a display 50 or as part of a display system manufacturing process.

A display 50 (or a partially complete display device) is provided in step 200. The transparent capacitive apparatus 5 is assembled in step 205 as part of the display 50, for example with the first transparent substrate 10 as the cover of the display 50. The first patterned conductive layer 12, dielectric layer 30, second patterned conductive layer 22 and second transparent substrate 20 are provided on the first transparent substrate 10. This is useful for a top-emitter display that emits or controls light seen through the display cover 52 and in liquid crystal displays that have a back light. Alternatively, the second transparent substrate 20 of the transparent capacitive apparatus 5 is assembled as the display cover of 52. In other embodiments, the first or second transparent substrate 10, 20 of the transparent capacitive apparatus 5 is assembled as the substrate 56 of the display 50. This is useful for a bottom-emitter display device that emits or controls light seen through the display substrate 56. Alternatively, the first or second transparent substrate 10, 20 of the transparent capacitive apparatus 5 is affixed to the display cover 52 or display substrate 56.

Once the display system 60 is assembled, electrical connections can be made to the electrodes of the transparent capacitive apparatus 5 (and the display 50) in step 210. The electrical connections are connected to a controller in step 215 and electrical power and signals provided to the transparent capacitive apparatus 5 in step 220. The provided electrical power and signals are used to test the capacitance of the capacitors 33, for example by scanning the array of capacitors under the control of the controller, in step 225. This measurement provides a baseline capacitance value for each capacitor.

A user can then touch or otherwise locate a conductive element (e.g. one or more fingers) near the transparent capacitive apparatus 5 in step 230 to modify the local electrical field near one or more of the capacitors 33 and thereby modify the capacitance of the nearby capacitors 33. The provided electrical power and signals are used to test the capacitance of the capacitors a second time in step 235 and a change in capacitance of one or more of the capacitors is determined in step 240 by comparing the corresponding capacitance measurements to the baseline values measured in the absence of the conductive element. By locating the capacitor(s) having the changed capacitive values, the location of the touch can be determined in step 245. The transparent capacitive apparatus, according to an embodiment of the present invention, thus provides a capacitive touch screen useful in combination with a display.

The characteristics of the transparent capacitive apparatus 5 are determined by a number of factors. The transparency is determined by the transparency of the first and second transparent substrates 10, 20, the dielectric layer 30, and any encapsulation layers. The transparency is also determined by the amount of area that is covered by capacitors 33 and the ratio of conductive areas 34 to non-conductive areas 36 in the capacitors 33. The electrodes also reduce transparency. Thus, in order to make the transparent capacitive apparatus 5 as transparent as possible, it is useful to make the non-conductive areas 36 as large as possible and the electrodes and conductive areas 34 as small as possible. However, this reduces the conductivity of the transparent capacitive apparatus 5 and thereby decreases the signal-to-noise ratio of a capacitor sensing signal.

The conductivity of the transparent capacitive apparatus 5 is determined by the conductivity of the conductive materials, the thickness of the conductive materials in the electrodes and conductive areas, and the area of the electrodes and conductive areas. Thus, by increasing the thickness and area of the conductive materials, conductivity is improved at the expense of transparency.

The present invention provides an improved transparency and conductivity of a transparent capacitive apparatus be enabling multiple layers of aligned conductors to form capacitors that, because they are aligned, do not reduce transparency. Hence, by adding additional layers of conductive materials in alignment, conductivity is improved. While any encapsulation layers reduce transparency, that effect is relatively small compared to the reduction in transparency due to the conductive materials. Using methods of the prior art, it is difficult to make thin-films of conductive materials (such as metals), thick enough to provide adequate conductivity and with sufficiently fine lines as to be invisible to a user. Likewise, multiple layers are difficult to achieve without very expensive photolithographic equipment and multiple processing steps. Transparent conductive materials (e.g. metal oxides) do not have the desired conductivity and transparency for many applications. Hence, the present invention provides improved transparency and conductivity for a transparent capacitive apparatus, while reducing manufacturing costs.

The present invention has been demonstrated experimentally. In a first experiment, a 0.1 mm substrate of polyethylene teraphthalate was coated with a metal nickel layer of approximately 70 nm with a surface resistance of 6.8+/−0.2 ohms/square and processed by using an 830 nm infrared laser having a 2.5 μm spot size to ablate gaps of approximately 5 μm wide in the metal nickel layer forming electrode lines of 2.5 mm. The patterned metal nickel layer was spin coated with a 10% solution by weight of polyvinylpyrolidine (PVP) in isopropyl alcohol (IPA) at 3000 rpm. A second, identical substrate was prepared and positioned with its polymer-coated face in contact over the first substrate coated face and with a 90 degree relative orientation so that the electrodes on the first substrate were at 90 degrees with respect to the electrodes on the second substrate. The oriented substrates were located within a fixture and held in place and together with a vacuum platen. The 830 nm infrared laser was scanned image-wise over the oriented substrates to heat hexagonal portions of the metal layer to coalesce the metal in the heated portions, leaving conductive hexagonal grid line areas of approximately 25 μm wide separating hexagonal transparent, non-conductive areas having sides approximately sides 377 μm in length. The transparent non-conductive areas were visually transparent with a shadow area (space-to-grid) corresponding to a nominal transparency of 92%. The grid patterns were formed on the first and second substrate in perfect registration as observed in transmission or reflection mode with an optical microscope. The conductive hexagonal grid lines separately prepared on Ni coated substrates (initially 6.8+/−0.2 ohms/square) as above but exposed one at a time had a surface resistivity of 272 ohms/square after coalescence patterning.

In a second experiment, a 0.1 mm substrate of polyethylene teraphthalate was coated with a metal nickel layer of approximately 70 nm with a surface resistance of 6.8+/−0.2 ohms/square and processed. The unpatterned metal nickel layer was spin coated with a 7.5% solution of polymethylcyanoacrylate-co-polyethylcyanoacrylate in a 1:1 mixture by weight of cyclopentanone and acetonitrile at 3000 rpm. The substrate was located within the fixture and held in place with the vacuum platen. The 830 nm infrared laser was image-wise scanned over the oriented substrates to coalesce the nickel in parallel lines separating electrodes. The electrodes had a width of approximately 2.5 mm separated by non-conductive coalesced gaps of approximately 11 μm. A second substrate was prepared in the same way and positioned with adjacent polymer-coating face-to-face over the first substrate and with a 90 degree relative orientation so that the electrodes on the first substrate were at 90 degrees with respect to the electrodes on the second substrate. The oriented substrates were located within the fixture and held in place with a vacuum platen. The 830 nm infrared laser was image-wise scanned over the oriented substrates to heat hexagonal portions of the metal layer to coalesce the metal in the heated portions, leaving conductive hexagonal grid line areas of approximately 25 μM wide separating hexagonal transparent, non-conductive areas having sides approximately sides 377 μm in length. The grid patterns were formed on the first and second substrate in essentially perfect registration as observed with optical microscopy.

By employing multiple bi-layers for each substrate, the resistivity can be reduced by a factor corresponding to the number of bi-layers without significantly affecting the transparency of the device, for example giving a resistivity of 90 ohms per square with two bi-layers without increasing the nominal transparency of 92%. Further improvements in conductivity without significantly reducing transparency can be made by using more conductive metals, better quality laser exposure providing cleaner and finer lines, and using electrically conductive encapsulating layers. Transparency and optical clarity can be improved by reducing the thickness of the encapsulating, dielectric, and substrate layers.

The present invention provides apparatus and an improved method for providing increased conductivity and transparency to the electrodes of a capacitive device that is scalable to large sizes, avoids heating materials in emissive locations to high temperatures, and avoids the use of chemical processes. By employing multiple layers of aligned patterned conductors separated by intervening layers to form electrodes, conductor conductivity can be improved to a desired extent. By using heat-induced coalescence to pattern the conductors in an electrode, no chemical or photolithographic processes are needed, alignment of the different conductive layers in the electrodes is provided in a single step, the production of particulate contamination eliminated, and the metal layers can be made relatively transparent. By integrating the present invention as a display substrate or cover, a layer of material can be eliminated, reducing reflections and optical interference.

The invention has been described in detail with particular reference to certain embodiments thereof, but it will be understood that variations and modifications can be effected within the spirit and scope of the invention.

PARTS LIST

A coalesced material surface area
D distance

T thickness
5 transparent capacitor apparatus
10 first transparent substrate
11 first substrate structure
12, 12a, 12b first patterned conductive layer
14 first conductive material
16 coalesced conductive material structure
18, 18a, 18b first encapsulating layer
20 second transparent substrate
21 second substrate structure
22, 22a, 22b second patterned conductive layer
24 second conductive material
24b dark conductive material
28, 28a, 28b second encapsulating layer
29 bi-layer
30 dielectric layer
32 overlapping portions
33 capacitor
34 conductive area
36 non-conductive area
38 electrical field
40 vertical first electrode, column electrode
42 horizontal second electrode, row electrode
44 electrode gap
50 display
52 display cover
54 display light-control layers
56 display substrate
60 display system
70 electrical connections
80 controller
90 laser
92 laser beam
100 provide first substrate step
105 form first conductive layer step
110 form first encapsulating layer step
111 provide dielectric layer step
115 pattern first conductive layer step
120 provide second substrate step
125 form second conductive layer step
130 form second encapsulating layer step
131 provide dielectric layer step
135 pattern second conductive layer step
140 locate first and second substrates step
150 laminate step
160 align heat source step
165 pattern-wise heat first and second conductive layers step
170 locally melt first and second conductive material portion step
175 pattern-wise coalesce conductive material step
160 provide display device on substrate step
180 anneal layers step
200 provide display device step
205 assemble first substrate as cover step
210 connect electrodes step
215 connect controller step
220 provide electrical power and signals step
225 test capacitance step
230 provide conductive touch step
235 scan electrodes and test capacitance step
240 determine capacitance change step
245 determine touch location step

The invention claimed is:

1. A method of making a transparent capacitor apparatus, comprising:
providing a first transparent substrate including a first patterned conductive layer having a first conductive material over the first transparent substrate in a first pattern;
providing a second transparent substrate including a second patterned conductive layer having a second conductive material over the second transparent substrate in a second pattern different from the first pattern;
locating the second transparent substrate over the first transparent substrate so that the first patterned conductive layer is effectively parallel to the second patterned conductive layer; and
patterning overlapping portions of both the first conductive layer and the second conductive layer at the same time into spatially matching conductive areas and non-conductive areas by locally applying heat to melt the first and second conductive materials in the non-conductive areas of both the first conductive layer and the second conductive layer so that the surface tension of the first and second conductive materials causes the first and second conductive materials to coalesce into structures with a reduced conductive layer area.

2. The method according to claim 1, further including providing a dielectric layer between the first patterned conductive layer and the second patterned conductive layer.

3. The method according to claim 1, further including patterning the first patterned conductive layer with the first pattern or patterning the second patterned conductive layer with the second pattern.

4. The method according to claim 1, further including providing a first encapsulating layer over the first conductive layer or providing a second encapsulating layer over the second conductive layer.

5. The method according to claim 4, wherein the first encapsulating layer is conformal with the coalesced structures of the first conductive material or wherein the second encapsulating layer is conformal with the coalesced structures of the second conductive material.

6. The method according to claim 4, wherein the first encapsulating layer or the second encapsulating layer is a dielectric layer and is located between the first conductive layer and the second conductive layer.

7. The method according to claim 1, wherein the first transparent substrate or the second transparent substrate is a dielectric layer and is located between the first conductive layer and the second conductive layer.

8. The method according to claim 1, further including laminating the first conductive layer to the second conductive layer with a dielectric layer located between the first conductive layer and the second conductive layer.

9. The method according to claim 8, wherein the step of laminating is done before the heat is locally applied.

10. The method according to claim 8, wherein the step of laminating is done after the heat is locally applied.

11. The method according to claim 1, further including annealing the first substrate, second substrate and dielectric.

12. The method according to claim 1, wherein the heat is locally applied with a laser.

13. The method according to claim 1, further including:
providing a third transparent substrate including a third conductive layer having a third conductive material over the third transparent substrate in the first pattern;
locating the third transparent substrate with the first transparent substrate so that the third conductive layer is over or under the first conductive layer in effectively parallel planes; and
patterning overlapping portions of both the first conductive layer and the third conductive layer at the same time into spatially matching conductive areas and non-conductive areas by locally applying heat to melt the first and third conductive materials in the non-conductive areas of both the first conductive layer and the third conductive layer so that surface tension of the first and third conductive materials causes the first and third conductive materials to coalesce into structures with a reduced conductive layer area.

14. The method according to claim 13, further including laminating the first conductive layer to the third conductive layer with a transparent layer located between the first conductive layer and the third conductive layer.

15. The method according to claim 1, further including a forming a first electrical connection to the first patterned conductive layer or forming a second electrical connection to the second patterned conductive layer, and electrically connecting the first and second electrical connections to an electrical power source or electrical sensing device.

16. The method according to claim 1, further including patterning the first and second patterned conductors into a plurality of electrically separate corresponding first and second electrodes forming an addressable array of capacitors.

17. A method of using a transparent capacitor apparatus including:
providing a transparent capacitor made according to claim 16;
electrically connecting electrical power or electrical sensing circuitry to the first and second electrodes;
electrically scanning the first and second electrodes to determine a first capacitance of each capacitor in an addressable array of capacitors;
touching an electrically conductive element to at least one of the capacitors;
electrically scanning the first and second electrodes a second time to determine a second capacitance of each capacitor in an addressable array of capacitors;
comparing the first and second capacitances of each capacitor in an addressable array of capacitors to determine the capacitor having a capacitance change; and
determining the location of the capacitor having the capacitance change to find the location of the touch in the transparent capacitor apparatus.

18. A method of making a display system, comprising:
providing a transparent capacitor apparatus made according to the method of claim 1;
providing a display device having a cover and a substrate; and
assembling the first substrate of the transparent capacitor apparatus as the cover or substrate of the display device or affixing the first substrate of the transparent capacitor apparatus to the cover or to the substrate of the display device.

19. The method according to claim 1, further including coating the first conductive layer on the first transparent substrate, patterning the first conductive layer, coating the second transparent substrate over the first conductive layer, patterning the second conductive layer, and patterning the first conductive layer and the second conductive layer into matching conductive areas and non-conductive areas.

20. The method according to claim 19, further including coating an encapsulating layer over the second conductive layer.

21. The method according to claim 1, further including patterning the first or second conductive layer by depositing a conductive ink in a pattern with an inkjet device and curing the deposited conductive ink.

* * * * *